United States Patent
Takahashi et al.

(10) Patent No.: US 8,956,028 B2
(45) Date of Patent: Feb. 17, 2015

(54) LIGHT PROJECTION UNIT AND LIGHT PROJECTION APPARATUS

(75) Inventors: Koji Takahashi, Osaka (JP); Yoshiyuki Takahira, Osaka (JP); James Suckling, Oxford (GB); David Montgomery, Oxford (GB)

(73) Assignee: Sharp Kabushiki Kaisha, Osaka-shi (JP)

( * ) Notice: Subject to any disclaimer, the term of this patent is extended or adjusted under 35 U.S.C. 154(b) by 287 days.

(21) Appl. No.: 13/451,267

(22) Filed: Apr. 19, 2012

(65) Prior Publication Data

US 2012/0275134 A1    Nov. 1, 2012

(30) Foreign Application Priority Data

Apr. 28, 2011 (JP) .................. 2011-101974

(51) Int. Cl.
| | |
|---|---|
| *B60Q 1/00* | (2006.01) |
| *B60Q 3/00* | (2006.01) |
| *G03B 21/20* | (2006.01) |
| *F21V 9/16* | (2006.01) |
| *H01S 5/40* | (2006.01) |
| *H01S 5/00* | (2006.01) |
| *F21Y 101/02* | (2006.01) |

(52) U.S. Cl.
CPC ............... *G03B 21/204* (2013.01); *F21V 9/16* (2013.01); *H01S 5/4012* (2013.01); *H01S 5/005* (2013.01); *H01S 5/4031* (2013.01); *F21Y 2101/025* (2013.01)
USPC ............ 362/538; 362/509; 362/615; 362/257

(58) Field of Classification Search
CPC .............. F21S 48/1154; F21S 48/1159; F21S 48/1241; F21S 48/2293; F21S 48/1225; G02B 6/0088; G02B 6/0001
USPC ........... 362/84, 509, 260, 259, 615, 510, 538, 362/516, 257; 349/62, 63
See application file for complete search history.

(56) References Cited

U.S. PATENT DOCUMENTS

| | | |
|---|---|---|
| 2005/0018147 A1 | 1/2005 | Lee et al. |
| 2005/0105301 A1 | 5/2005 | Takeda et al. |
| 2009/0046474 A1* | 2/2009 | Sato et al. ............... 362/466 |
| 2009/0052189 A1 | 2/2009 | Kon |
| 2009/0066920 A1 | 3/2009 | Yamagishi et al. |
| 2010/0277670 A1* | 11/2010 | Hamada .................. 349/62 |
| 2011/0044070 A1 | 2/2011 | Takahashi |
| 2011/0216550 A1* | 9/2011 | Koike et al. ............. 362/519 |
| 2012/0068630 A1 | 3/2012 | Li et al. |
| 2012/0106178 A1* | 5/2012 | Takahashi et al. ....... 362/459 |
| 2012/0224384 A1* | 9/2012 | Takahira et al. ......... 362/509 |
| 2012/0236536 A1* | 9/2012 | Harada ................... 362/84 |

FOREIGN PATENT DOCUMENTS

| | | |
|---|---|---|
| CN | 101270863 | 9/2008 |
| EP | 1 605 199 | 12/2005 |
| JP | 7-318998 | 12/1995 |
| JP | 2003-295319 | 10/2003 |
| JP | 2004-241142 | 8/2004 |
| JP | 2005-150041 | 6/2005 |
| JP | 2010-232044 | 10/2010 |
| JP | 2011-65979 | 3/2011 |
| WO | WO-2009/112361 | 9/2009 |
| WO | WO-2009/112961 | 9/2009 |
| WO | WO-2010/133090 | 11/2010 |

* cited by examiner

*Primary Examiner* — Anh Mai
*Assistant Examiner* — Kevin Quarterman
(74) *Attorney, Agent, or Firm* — Morrison & Foerster LLP

(57) ABSTRACT

A light projection unit capable of improving light use efficiency is provided. This light projection unit includes: a fluorescent member that includes an illuminated surface to which laser light is directed, converts at least part of the laser light into fluorescent light and outputs the fluorescent light from chiefly the illuminated surface; and a reflection member that includes a first reflection surface which reflects the fluorescent light output from the fluorescent member. The illuminated surface of the fluorescent member is inclined with respect to a predetermined direction in such a way that the illuminated surface faces in a direction opposite to a light projection direction.

20 Claims, 19 Drawing Sheets

RADIATION ANGLE [°] OF FLUORESCENT LIGHT
OUTPUT FROM FLUORESCENT MEMBER

| ANGLE RANGE | PERCENTAGE IN TOTAL LIGHT AMOUNT [%] |
|---|---|
| -10~10 | 18.2 |
| -20~20 | 35.0 |
| -30~30 | 50.8 |
| -45~45 | 71.3 |
| -60~60 | 87.0 |
| -70~70 | 94.3 |
| -80~80 | 98.6 |
| -90~90 | 100 |

LIGHT PROJECTION UNIT AND LIGHT PROJECTION APPARATUS

This application is based on Japanese Patent Application No. 2011-101974 filed on Apr. 28, 2011, the contents of which are hereby incorporated by reference.

BACKGROUND OF THE INVENTION

1. Field of the Invention

The present invention relates to a light projection unit and a light projection apparatus, more particularly, to a light projection unit and a light projection apparatus that include a fluorescent member to which laser light is directed.

2. Description of Related Art

Conventionally, a light projection apparatus, which includes a fluorescent member to which laser light is directed, is known. The light projection apparatus as a conventional example includes: a laser generator that outputs laser light; a fluorescent member that includes an illuminated surface to which the laser light output from the laser generator is directed and which converts the laser light into fluorescent light and outputs the fluorescent light; and a reflection member that reflects the fluorescent light output from the fluorescent member. In a general fluorescent member, the fluorescent light is output in all directions. In other words, the fluorescent light is output from an illuminated surface, a rear surface (surface opposite to the illuminated surface) and a side surface disposed between the illuminated surface and the rear surface. And, part of the light output from the fluorescent member is reflected frontward by the reflection member.

Here, the light projection apparatus, which includes the laser generator, the fluorescent member and the reflection member, is disclosed in JP-A-1995-318998, for example.

However, in the above light projection apparatus as the conventional example, part of the light output from the fluorescent member exits to outside via the reflection member, while the rest of the light output from the fluorescent member is output directly to the outside without being reflected by the reflection member. Because of this, light uncontrollable by the reflection member increases, so that light which reaches a desired region decreases. Because of this, there is a problem that it is hard to efficiently illuminate a desired region and it is hard to improve light (fluorescent light) use efficiency.

SUMMARY OF THE INVENTION

The present invention has been made to solve the above problems, and it is an object of the present invention is to provide a light projection unit and a light projection apparatus that are able to improve the light use efficiency.

To achieve the above object, a light projection unit according to the present invention is a light projection unit that projects light in a predetermined direction and includes: a fluorescent member that includes an illuminated surface to which laser light is directed, converts at least part of the laser light into fluorescent light and outputs the fluorescent light from chiefly the illuminated surface; and a reflection member that includes a first reflection surface which is disposed to oppose the illuminated surface of the fluorescent member and reflects the fluorescent light output from the fluorescent member; wherein the illuminated surface of the fluorescent member is inclined with respect to the predetermined direction in such a way that the illuminated surface faces in a direction opposite to a light projection direction.

Here, the language "outputs the fluorescent light from chiefly the illuminated surface" means a case where about 90% or more of the fluorescent light output from the fluorescent member is output from the illuminated surface, and includes a case where the laser light is converted into the fluorescent light near a surface of the illuminated surface and output from the illuminated surface and a case where a rear surface (surface opposite to the illuminated surface) of the fluorescent member is directly mounted on a reflection surface and the fluorescent light is not substantially output from the rear surface.

The light projection unit according to the present invention, as described above, is provided with the fluorescent member that outputs the fluorescent light from chiefly the illuminated surface and with the reflection member that includes the first reflection surface which reflects the fluorescent light output from the fluorescent member. Because of this, most part of the light (fluorescent light) output from the fluorescent member is reflected by the reflection member.

Besides, as described above, the illuminated surface of the fluorescent member is inclined with respect to the predetermined direction in such a way that the illuminated surface faces in the direction opposite to the light projection direction, whereby it is possible to alleviate the light output from the fluorescent member exiting directly to outside without being reflected by the reflection member.

In the above light projection unit, preferably, the illuminated surface of the fluorescent member is inclined by an angle of more than 0 degrees to 30 degrees or smaller with respect to the predetermined direction.

In the above light projection unit, preferably, a light intensity distribution of the fluorescent light output from the fluorescent member is a Lambertian distribution. According to this structure, the light output from the fluorescent member is high in light intensity in a perpendicular line direction of the illuminated surface and becomes nearly zero in light intensity in a direction parallel with the illuminated surface. Because of this, it is possible to alleviate the light output from the fluorescent member exiting directly to the outside without being reflected by the reflection member.

In the above light projection unit, preferably, a line connecting a center of the illuminated surface of the fluorescent member and an end portion of the first reflection surface in the predetermined direction with each other is inclined in the predetermined direction by 60 degrees or more with respect to the perpendicular line of the illuminated surface of the fluorescent member.

In the above light projection unit in which the light intensity distribution of the fluorescent light output from the fluorescent member is the Lambertian distribution, preferably, a thickness of the fluorescent member is one tenth of or smaller than a dimension across both ends of the illuminated surface. According to this structure, it is possible to easily obtain the light intensity distribution of the fluorescent light output from the fluorescent member as the Lambertian distribution.

Here, the language "dimension across both ends" means, for example, a diameter of a circular shape; a major diameter or a minor diameter of an elliptic shape; a length of a longer edge or of a shorter edge of a rectangular shape.

In the above light projection unit in which the light intensity distribution of the fluorescent light output from the fluorescent member is the Lambertian distribution, preferably, the illuminated surface of the fluorescent member is sufficiently larger than a spot region of the laser light that is directed to the illuminated surface. According to this structure, it is possible to easily obtain the light intensity distribution of the fluorescent light output from the fluorescent member as the Lambertian distribution.

The above light projection unit, preferably, further includes a metallic mount member on which the fluorescent member is mounted. According to this structure, it is possible to efficiently radiate heat generated by the fluorescent member, so that it is possible to alleviate the fluorescent member rising to a high temperature. Because of this, it is possible to alleviate the fluorescent member being deteriorated by the heat and light emission efficiency of the fluorescent member becoming low.

The above light projection unit, preferably, further includes a mount member that includes a mount surface on which the fluorescent member is mounted; wherein the mount surface is inclined in a direction opposite to the light projection direction with respect to the predetermined direction. According to this structure, for example, even if a thickness of the fluorescent member is even, it is possible to easily incline the illuminated surface of the fluorescent member in the direction opposite to the light projection direction with respect to the predetermined direction. Besides, the thickness of the fluorescent member may be formed evenly, so that it is possible to easily produce the fluorescent member.

In the above light projection unit, preferably, the first reflection surface is formed so as to include at least part of either of a parabolic surface and an elliptic surface. According to this structure, by positioning the fluorescent member at a focal point of the first reflection surface, it is possible to easily collimate or collect the light (illumination light) output from the light projection unit.

In this case, preferably, the first reflection surface is formed into a shape that is obtained by dividing one of the parabolic surface and the elliptic surface by means of a surface that intersects an axis which connects a focal point of the one of the parabolic surface and the elliptic surface and an apex of the one of the parabolic surface and the elliptic surface with each other and by dividing the one of the parabolic surface and the elliptic surface by means of a surface that is parallel with the axis which connects the focal point and the apex with each other. According to this structure, it is possible to achieve size reduction of the reflection member and the light projection unit.

The above light projection unit, preferably, further includes a light collection member that includes a light incident surface from which the laser light is input and a light output surface that has an area smaller than the light incident surface and outputs the laser light to the fluorescent member; wherein the light collection member has a function to change, in an inside of the light collection member, a traveling direction of the laser light that enters from the light incident surface and to guide the laser light to the light output surface. According to this structure, the laser light entering from the light incident surface travels in the light collection member being changed in the traveling direction and is output from the light output surface with an evened light intensity distribution.

Besides, the light output surface of the light collection member has the area smaller than the light incident surface, so that the laser light is collected and output from the light output surface with collected.

In the above light projection unit including the light collection member, preferably, the light collection member further includes a second reflection surface that reflects the laser light entering from the light incident surface and guides the laser light to the light output surface. According to this structure, it is possible to easily change, in the inside of the light collection member, the traveling direction of the laser light entering from the light incident surface and to guide the laser light to the light output surface. Because of this, it is possible to easily output, with the evened light intensity distribution, the laser light from the light output surface.

In the above light projection unit including the light collection member, preferably, the light output surface of the light collection member is disposed away from the illuminated surface of the fluorescent member by a predetermined distance. According to this structure, it is possible to alleviate the light output from the illuminated surface of the fluorescent member entering (returning to) from the light output surface of the light collection member.

In the above light projection unit in which the light output surface of the light collection member is disposed by the predetermined distance away from the illuminated surface of the fluorescent member, preferably, the light output surface of the light collection member is disposed away from the illuminated surface of the fluorescent member by a distance of 0.3 mm or more to 1.1 mm or smaller.

In the above light projection unit including the light collection member, preferably, the light collection member is inclined with respect to a perpendicular line of the illuminated surface of the fluorescent member. The light output from the fluorescent member is highest in light intensity in a perpendicular line direction of the illuminated surface; accordingly, by inclining the light collection member with respect to the perpendicular line of the illuminated surface, it is possible to alleviate the light output from the illuminated surface of the fluorescent member entering from the light output surface of the light collection member.

In this case, preferably, the light collection member is inclined in an direction opposite to the predetermined direction with respect to the perpendicular line of the illuminated surface of the fluorescent member. According to this structure, it is possible to alleviate the light, which is reflected by the reflection member to travel in the predetermined direction, entering the light collection member. In other words, it is possible to alleviate the light collection member being disposed on an optical path of the light reflected by the reflection member.

In the above light projection unit in which the light collection member is inclined with respect to the perpendicular line of the illuminated surface of the fluorescent member, preferably, the light collection member is inclined with respect to the perpendicular line of the illuminated surface of the fluorescent member by 10 degrees or more to 30 degrees or smaller.

In the above light projection unit including the light collection member, preferably, the laser light output from a plurality of laser generators is input from the light incident surface of the light collection member. By using this light collection member, it is possible to easily collect the laser light output from the plurality of laser generators. Because of this, it is especially effective to use this light collection member in the case where the plurality of laser generators are used as a light source.

In the above light projection unit, preferably, the fluorescent member includes a fluorescent body; and a volume occupation percentage of the fluorescent body in the fluorescent member is 90% or more. According to this structure, even in a case where the thickness of the fluorescent member is small, it is possible to alleviate the laser light passing through the florescent member and convert efficiently the laser light into the fluorescent light. Besides, the laser light directed to the fluorescent member is easily converted into the fluorescent light near the surface of the illuminated surface of the fluorescent member. Because of this, it is possible to easily output the fluorescent light form chiefly the illuminated surface of the fluorescent member.

A light projection apparatus according to the present invention includes: the light projection unit having the above structure; and a laser generator that outputs the laser light to the light projection unit.

DETAILED DESCRIPTION OF PREFERRED EMBODIMENTS

Hereinafter, embodiments of the present invention are described with reference to the drawings. Here, for the sake of easy understanding, there is a case where hatching is not applied to even a sectional view and a case where hatching is applied to a view even if it is not a sectional view.

First, with reference to FIG. 1 to FIG. 24, a structure of a light projection apparatus 1 according to an embodiment of the present invention is described. Here, for simple drawings, semiconductor laser devices 11 are shown with some skipped.

Figure 1:
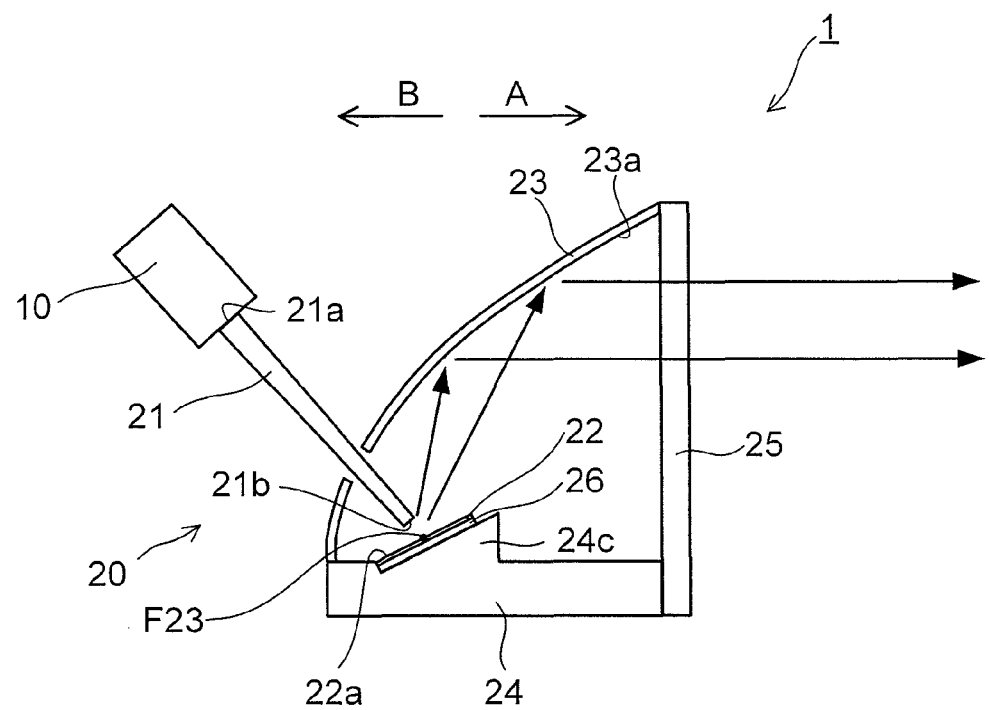
FIG. 1 is a sectional view showing a structure of a light projection apparatus that includes a light projection unit according to an embodiment of the present invention.
Figure 2:
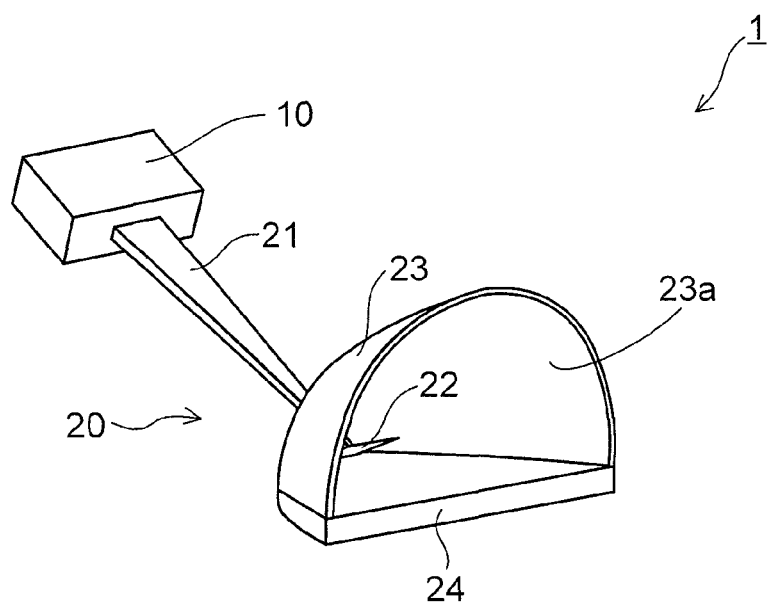
FIG. 2 is a perspective view showing a structure of a light projection apparatus according to an embodiment of the present invention.

The light projection apparatus 1 according the embodiment of the present invention is used as a head light that illuminates in front of an automobile and the like, for example. The light projection apparatus 1, as shown in FIG. 1 and FIG. 2, includes: a laser generation apparatus 10 that functions as a laser light source (excitation light source); and a light projection unit 20 that uses laser light output from the laser generation apparatus 10 to project light in a predetermined direction (A direction). Here, in FIG. 2, for the sake of easy understanding, of the light projection unit 20, a mount portion 24c, a filter member 25 and a support plate 26, which are described later, are skipped.

Figure 3:
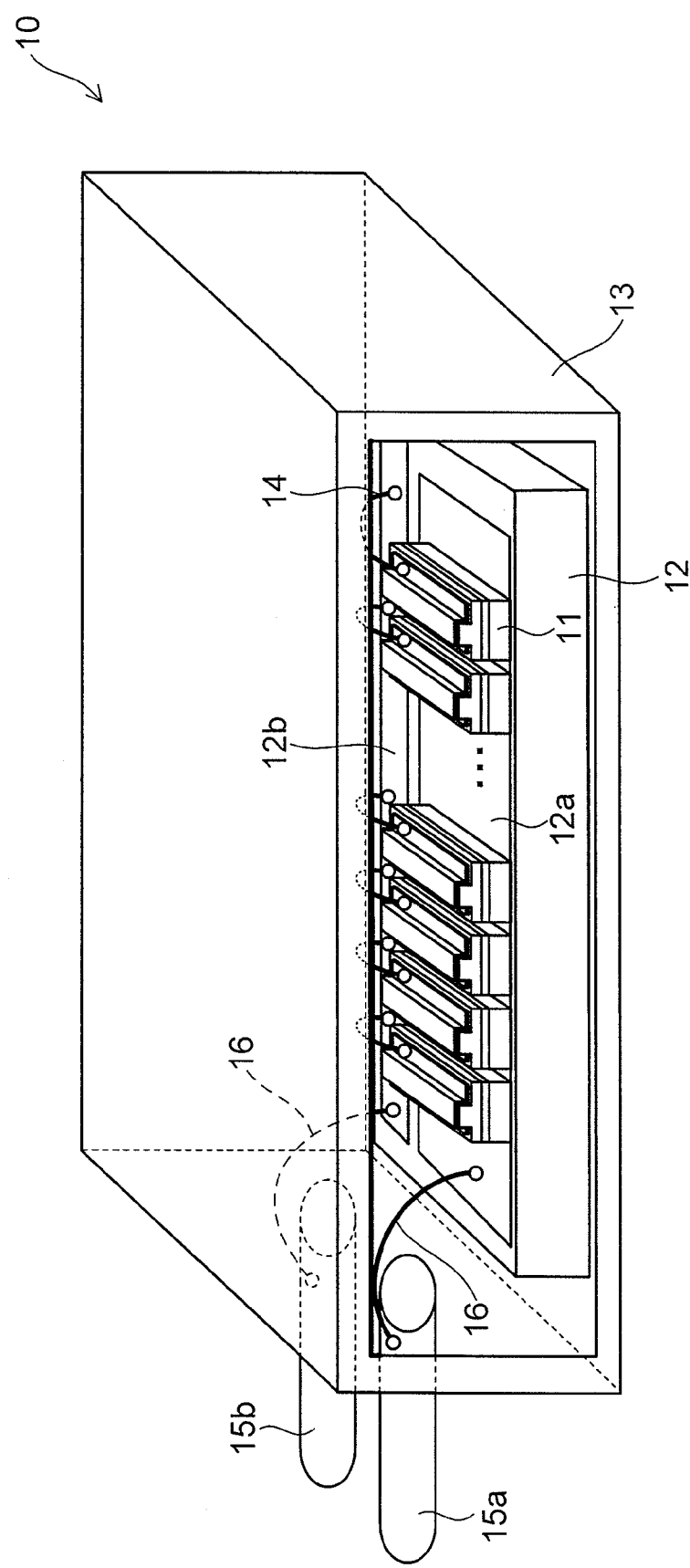
FIG. 3 is a perspective view showing a structure of a laser generation apparatus according to an embodiment of the present invention.

The laser generation apparatus 10, as shown in FIG. 3, includes: a plurality of semiconductor laser devices 11 (laser generators); a heat spreader 12 on which the plurality of semiconductor laser devices 11 are mounted; and a metallic housing member 13 that houses these components.

Figure 4:
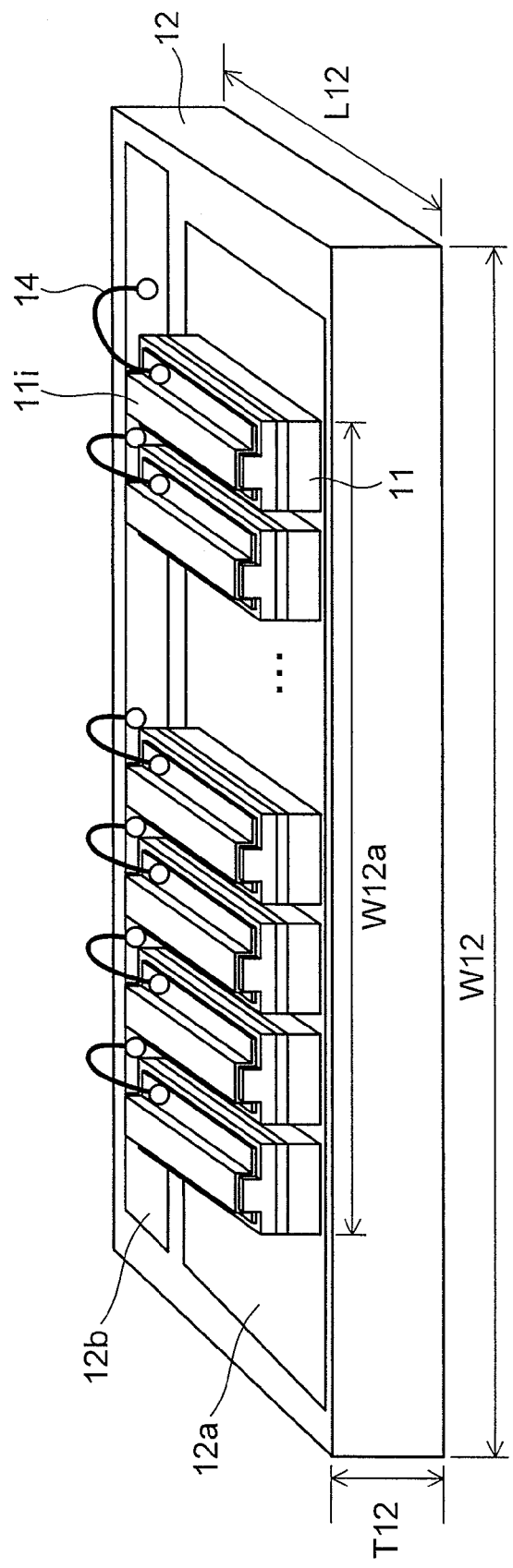
FIG. 4 is a perspective view showing structures of a semiconductor laser device and a heat spreader according to an embodiment of the present invention.

The heat spreader 12 is formed of a flat plate made of an aluminum nitride, for example, and is soldered to a bottom surface of the housing member 13. Besides, the heat spreader 12, as shown in FIG. 4, has, for example, a width (W12) of about 15 mm; a thickness (T12) of about 1 mm; and a depth (L12) of about 2 mm. Besides, on a mount surface of the heat spreader 12, electrode patterns 12a and 12b having an elongate shape are formed. On this electrode pattern 12a, the plurality of semiconductor laser devices 11 are ranged and mounted in a straight line. In the present embodiment, for example, a total of 13 semiconductor laser devices 11 are mounted, and disposed across a width (W12a) of about 10 mm. Here, it is desirable that this width (W12a) is smaller than a width (W21a) (see FIG. 9) of a light incident surface 21b of a light collection member 21, described later, of the light projection unit 20.

Figure 5:
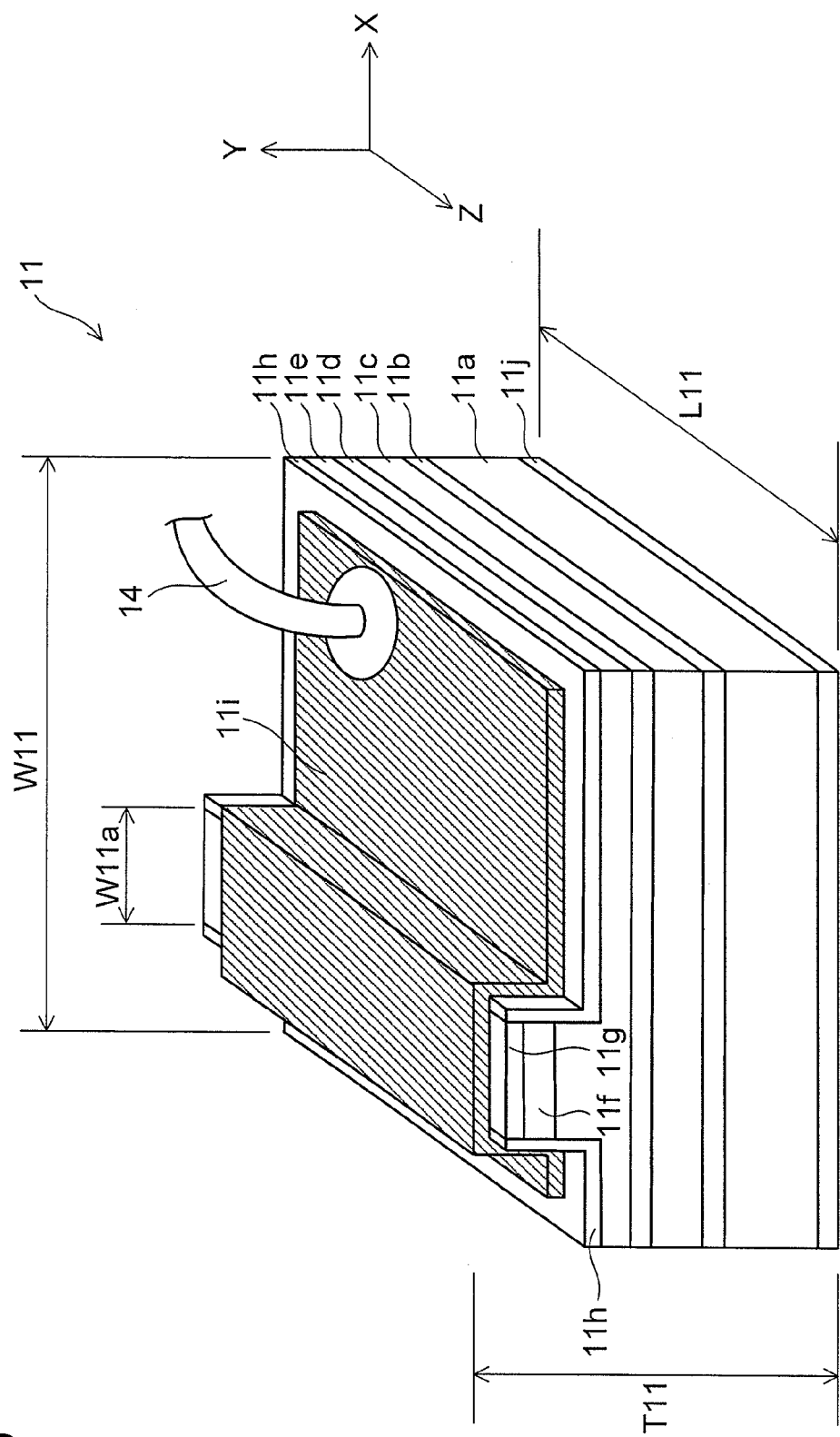
FIG. 5 is a perspective view showing a structure of a semiconductor laser device according to an embodiment of the present invention.

The semiconductor laser device 11 is, for example, a laser of broad area type, and outputs laser light that functions as excitation light. Besides, the semiconductor laser device 11 is structured so as to output blue-purple laser light that has a central wavelength of about 405 nm, for example. Besides, the semiconductor laser device 11, as shown in FIG. 5, has: for example, a width (W11) of about 200 μm; a thickness (T11) of about 100 μm; and a length (L11) of about 1000 μm.

Besides, the semiconductor laser device 11 includes: a substrate 11a that is formed of n type GaN and has a thickness of about 100 μm; and layers successively formed on the substrate 11a, which are a buffer layer 11b that is formed of n type GaN and has a layer thickness of about 0.5 μm; a lower clad layer 11c that is formed of n type $Al_{0.05}Ga_{0.95}N$ and has a layer thickness of about 2 μm; an active layer 11d that is formed of an InGaN multiple-quantum well; and an upper clad layer 11e that is formed of p type $Al_{0.05}Ga_{0.95}N$ and has a layer thickness of about 0.5 μm (thickest portion).

Besides, on a predetermined position of the upper clad layer 11e, a ridge extending in a Z direction (a length direction of the semiconductor laser device 11) is formed. On this ridge, there formed are: a contact layer 11f that is formed of p type GaN and has a layer thickness of about 0.1 μm; and an electrode 11g that is formed of Pd. Besides, an insulation film 11h formed of $SiO_2$ is formed so as to cover an upper surface of the upper clad layer 11e and side surfaces of the contact layer 11f and the electrode 11g. Besides, on a predetermined region of the insulation film 11h, there formed is a pad electrode 11i that covers the ridge and is in ohmic contact with the electrode 11g. Besides, on a lower surface of the substrate 11a, a rear surface electrode 11j formed of Hf/Al is formed.

And, as shown in FIG. 4, the pad electrode 11i of each semiconductor laser device 11 is electrically connected with the electrode pattern 12b of the heat spreader 12 via an Au wire 14. Besides, the rear surface electrode 11j (see FIG. 5) of each semiconductor laser device 11 is electrically connected with the electrode pattern 12a via a not-shown solder layer and the like. Here, it is a ridge width (W11a of FIG. 5) of the upper clad layer 11e that defines a width of a light emitting portion 11k (see FIG. 7) of the semiconductor laser device 11, and this ridge width is set at 7 μm, for example. In this case, the width of the light emitting portion 11k is about 7 μm.

Figure 6:
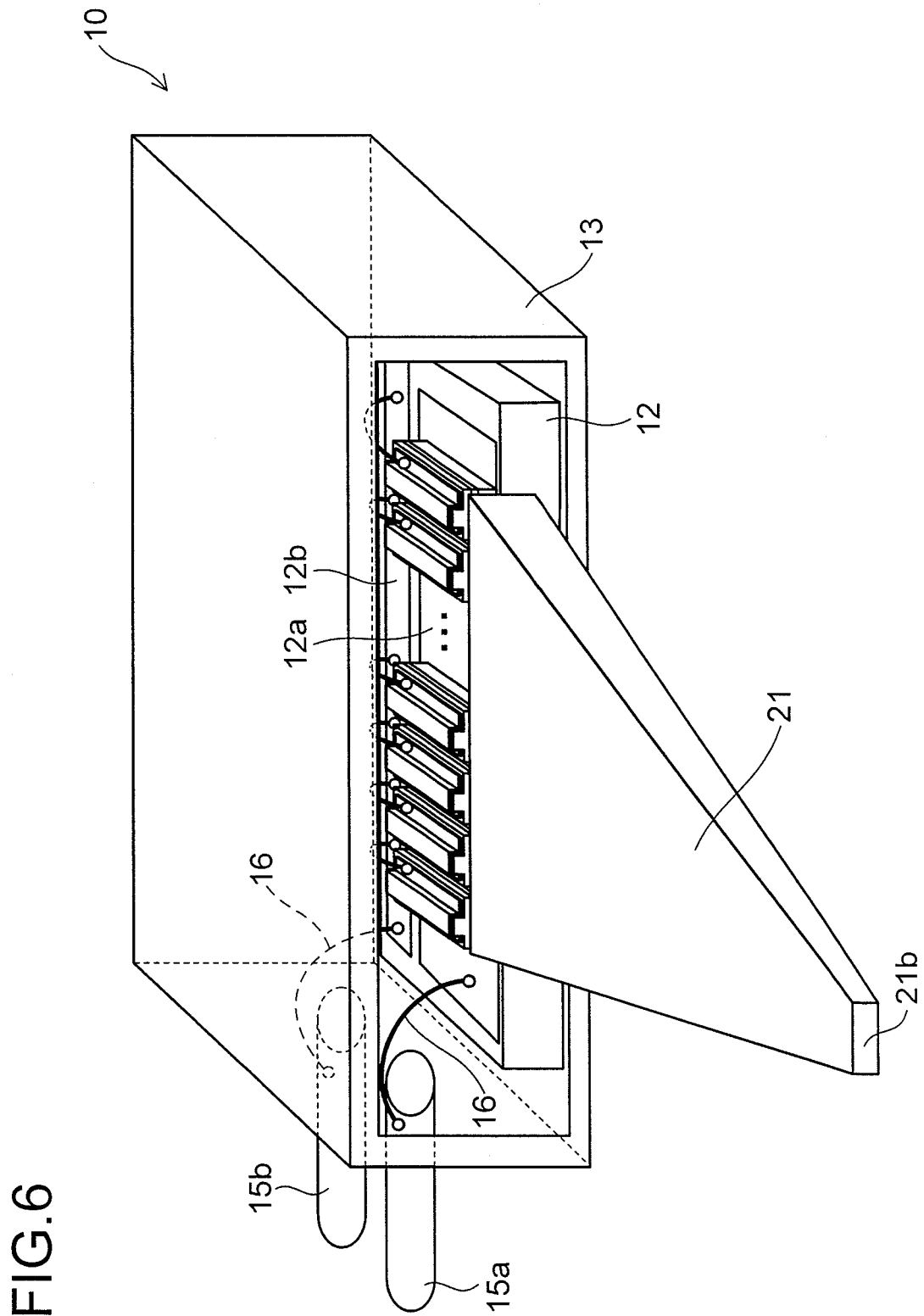
FIG. 6 is a perspective view showing a state in which a light collection member is mounted on a laser generation apparatus according to an embodiment of the present invention.

Besides, the housing member 13, as shown in FIG. 3, is formed into a box shape that has an opening portion at an output side of the laser light. Besides, in the housing member 13, electrode pins 15a and 15b for supplying electric power to the semiconductor laser device 11 are inserted. These electrode pins 15a and 15b are electrically connected with the electrode pattern 12a and electrode pattern 12b of the heat spreader 12 by means of metallic wires 16, respectively. Besides, a not-shown glass plate is mounted on the opening portion of the housing member 13, and an inactive gas is sealed in an inside of the housing member 13. Besides, the housing member 13 may be provided with a heat radiation fin (not shown) and the like and the housing member 13 may be air-cooled, for example. Here, as shown in FIG. 6, the light collection member 21 described later of the light projection unit 20 is fixed to a predetermined position of the glass plate via a transparent adhesive layer. Because of this, the laser light output from the plurality of semiconductor laser devices 11 enters the light collection member 21.

Figure 7:
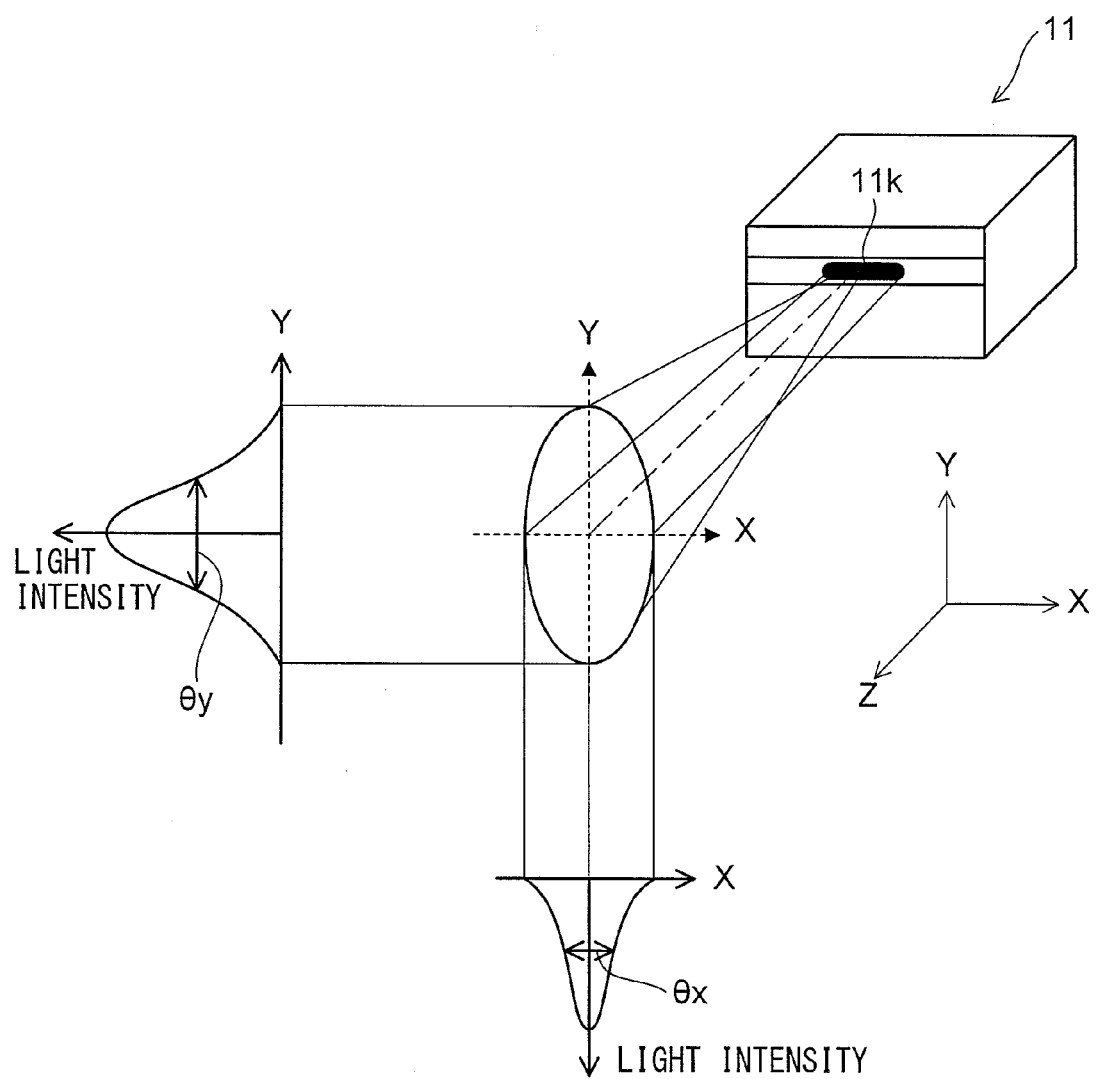
FIG. 7 is a view for describing laser light output from a semiconductor laser device according to an embodiment of the present invention.

Besides, when a d.c. current is applied across the pad electrode 11i and rear surface electrode 11j of the semiconductor laser device 11, as shown in FIG. 7, the laser light, which spreads into an elliptic shape in an X direction (width direction of the semiconductor laser device 11) and a Y direction (thickness direction of the semiconductor laser device 11), is output from the laser emitting portion 11k. A light intensity distribution of the elliptic light projected onto an XY plane perpendicular to a traveling direction (Z direction) of this laser light becomes a Gaussian distribution in both of the X direction and the Y direction. A full width at half maximum (θx) of the X-direction light intensity distribution is about 10°, while a full width at half maximum (θy) of the Y-direction light intensity distribution is about 20°, and the spread angle of the laser light in the Y direction is about two times larger than in the X direction. Because of this, this laser light travels spreading in the X direction as a minor axis direction and in the Y direction as a major axis direction.

Here, in a case where about 57 W electric power is supplied to the laser generation apparatus 10, output of the laser generation apparatus 10 becomes about 9.4 W. At this time, illuminance at a maximum illuminance point at 25 m in front of the light projection apparatus 1 becomes about 150 luxes (lx), and luminous flux, which is output to outside via a described-later reflection member 23, becomes about 533 lumens (lm).

The light projection unit 20, as shown in FIG. 1, is disposed on the laser light output side of the laser generation apparatus 10 (the semiconductor laser device 11), and includes: the light collection member 21 which collects and guides the laser light from the laser generation apparatus 10; a fluorescent member 22 that converts at least part of the laser light output from the light collection member 21 into fluorescent light and outputs the fluorescent light; the reflection member 23 that reflects the fluorescent light from the fluorescent member 22 in the predetermined direction (A direction); a mount member 24 on which the fluorescent member 22 is fixed; and a filter member 25 that is disposed at an opening portion of the reflection member 23.

Figure 8:
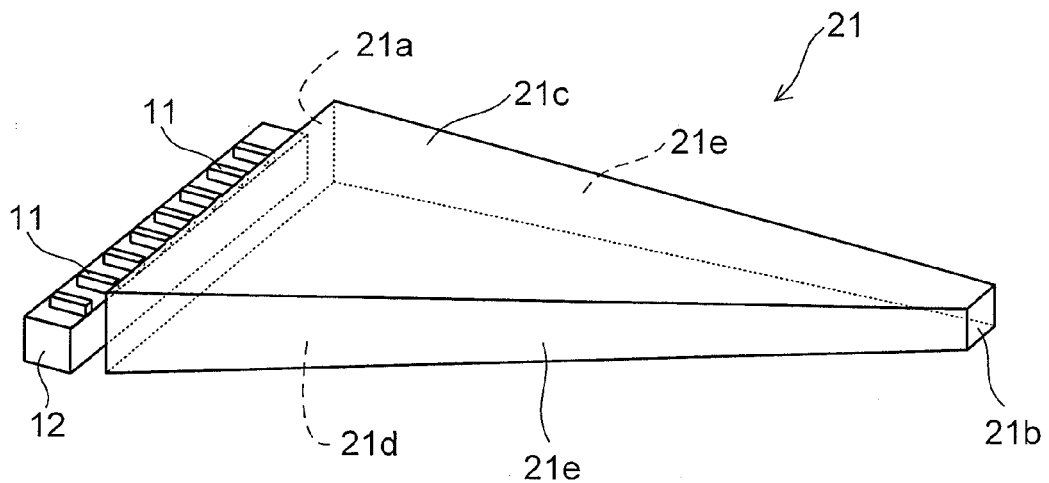
FIG. 8 is a perspective view showing a structure of a light collection member according to an embodiment of the present invention.

The light collection member 21 is formed of a member that has a light transmission characteristic. As the material of the light collection member 21, for example, there are glass such as borosilicate crown optical glass (BK7), synthetic quarts or the like, a resin and the like. Besides, the light collection member 21, as shown in FIG. 8, includes: a light incident surface 21*a* from which the laser light output from the plurality of semiconductor laser devices 11 is input; a light output surface 21*b* from which the laser light is output; an upper surface 21*c*, a lower surface 21*d* and a pair of side surfaces 21*e* that are disposed between the light incident surface 21*a* and the light output surface 21*b*. Here, the upper surface 21*a*, the lower surface 21*d* and the pair of side surfaces 21*e* are an example of a "second reflection surface" of the present invention.

Figure 9:
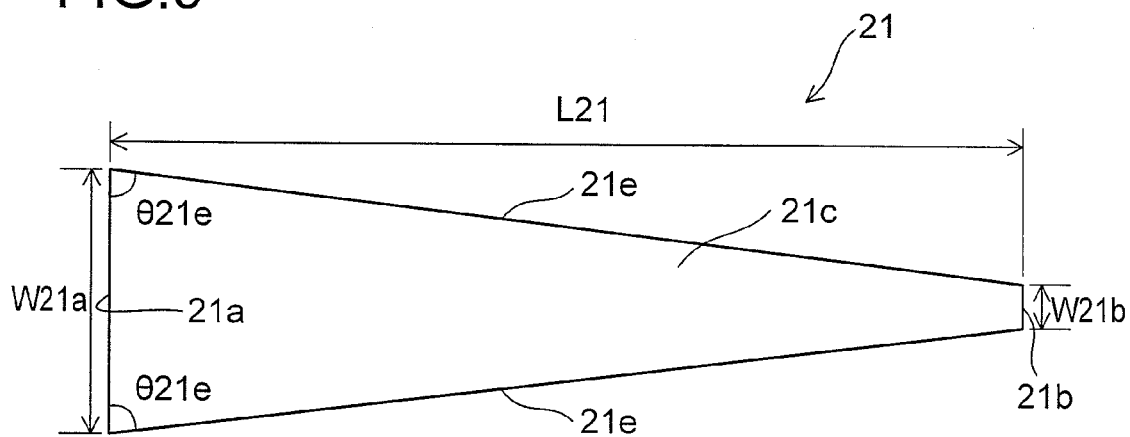
FIG. 9 is a top view showing a structure of a light collection member according to an embodiment of the present invention.
Figure 10:
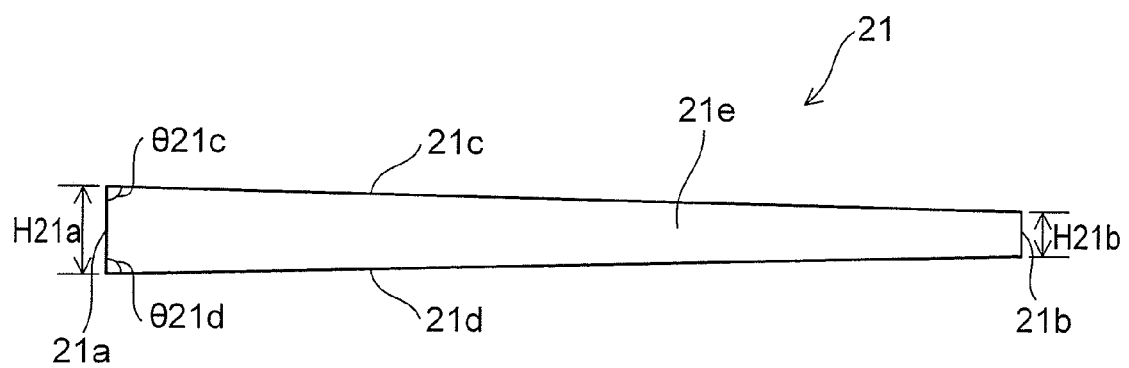
FIG. 10 is a side view showing a structure of a light collection member according to an embodiment of the present invention.

The light incident surface 21*a* is formed of a flat surface that has a substantially rectangular shape, for example. The light output surface 21*b* is formed of a flat surface that has a substantially square shape (quadrilateral shape), for example, and has an area smaller than the light incident surface 21*a*. Specifically, as shown in FIG. 9 and FIG. 10, the light incident surface 21*a* has a height (H21*a*) of about 2.24 mm and a width (W21*a*) of about 11.0 mm. Besides, the light output surface 21*b* has a height (H21*b*) of about 1.03 mm and a width (W21*b*) of about 1.03 mm. In other words, the light collection member 21 is tapered to be thinner in a width direction and in a thickness direction. Besides, on the light incident surface 21*a* and the light output surface 21*b*, not-shown antireflection (AR) films may be formed.

Besides, the light output surface 21*b* may be finished to be a frosted glass-like rough surface or a so-called moth-eye surface. In this case, it is possible to dramatically increase output efficiency when outputting the laser light from an inside of the light collection member 21 to outside via the light output surface 21*b*. In a case where the light output surface 21*b* is a flat surface, when the laser light reaches the light output surface 21*b* in the inside of the light collection member 21, a laser light component, which is reflected by an inner surface of the light output surface 21*b* and is not output to the outside, occurs. In contrast, by finishing the light output surface 21*b* to be the frosted glass-like rough surface or so-called moth-eye surface, the reflection at the inner surface of the light output surface 21*b* is alleviated and it is possible to efficiently output the light to the outside.

The upper surface 21*c* and the lower surface 21*d* are formed in the same shape as each other, and the pair of side surfaces 21*e* are formed in the same shape as each other. Besides, the upper surface 21*c*, the lower surface 21*d*, and the pair of side surfaces 21*e* have each a length (L21) of about 50 mm.

Besides, angles (θ21*c* and θ21*d*) of the upper surface 21*c* and the lower surface 21*d* with respect to the light incident surface 21*a* are larger than an angle (θ21 *e*) of the side surface 21*e* with respect to the light incident surface 21*a*.

Figure 11:
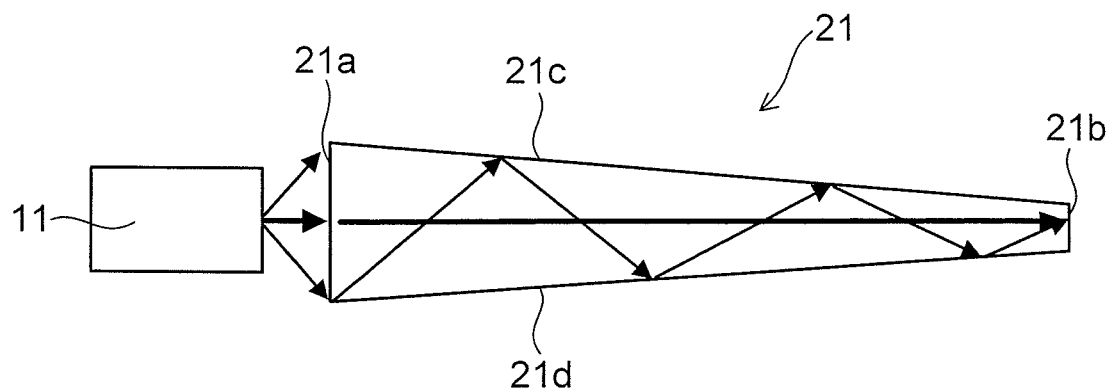
FIG. 11 is a side view for describing the traveling of laser light that enters a light collection member according to an embodiment of the present invention.
Figure 12:
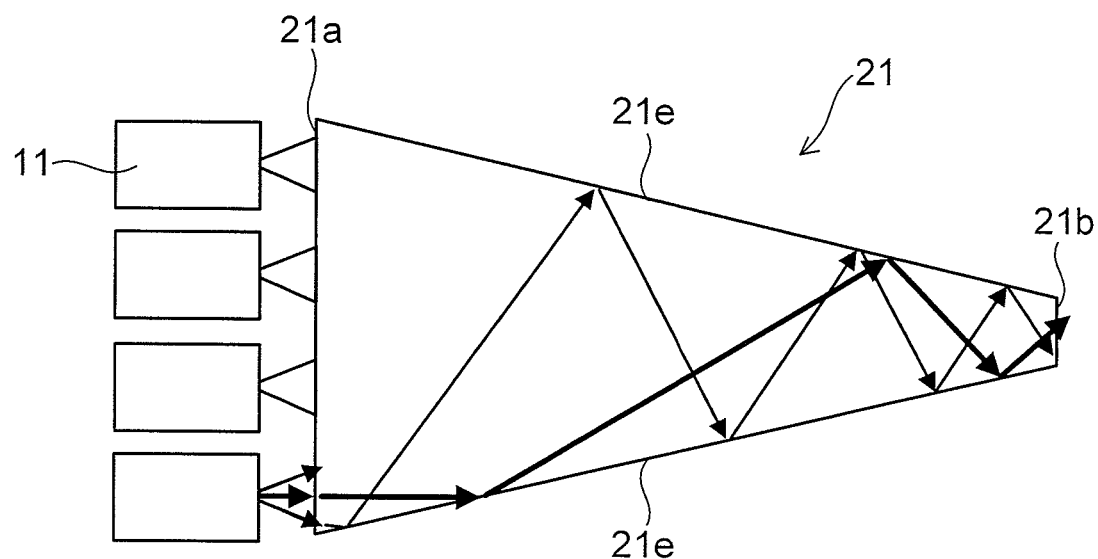
FIG. 12 is a top view for describing the traveling of laser light that enters a light collection member according to an embodiment of the present invention.

Here, the traveling of the laser light entering the light collection member 21 is simply described. As shown in FIG. 11 and FIG. 12, the laser light output from the semiconductor laser device 11 travels spreading in the major-axis direction and the minor-axis direction and enters from the light incident surface 21*a* of the light collection member 21. And, the laser light repeats total reflection at the upper surface 21*c*, the lower surface 21*d* and the pair of side surfaces 21*e*, is collected and guided to the light output surface 21*b*, and output from the light output surface 21*b* to the outside. In other words, the light collection member 21 has a function to change, in the inside of the light collection member 21, the traveling direction of the laser light entering from the light incident surface 21*a*, and guide the laser light to the light output surface 21*b*. Here, the laser light output from the semiconductor laser device 11 has the spread angle in the major-axis direction larger than in the minor-axis direction, so that it becomes hard to meet the total reflection condition at the upper surface 21*c* and the lower surface 21*d*. Because of this, by making the angles (θ21*c* and θ21*d*) (see FIG. 10) of the upper surface 21*c* and the lower surface 21*d* with respect to the light incident surface 21*a* larger than the angle (θ21*e*) (see FIG. 9) of the side surface 21*e* with respect to the light incident surface 21*a*, the total reflection condition is refrained from not being met at the upper surface 21*c* and the lower surface 21*d*.

Figure 13:
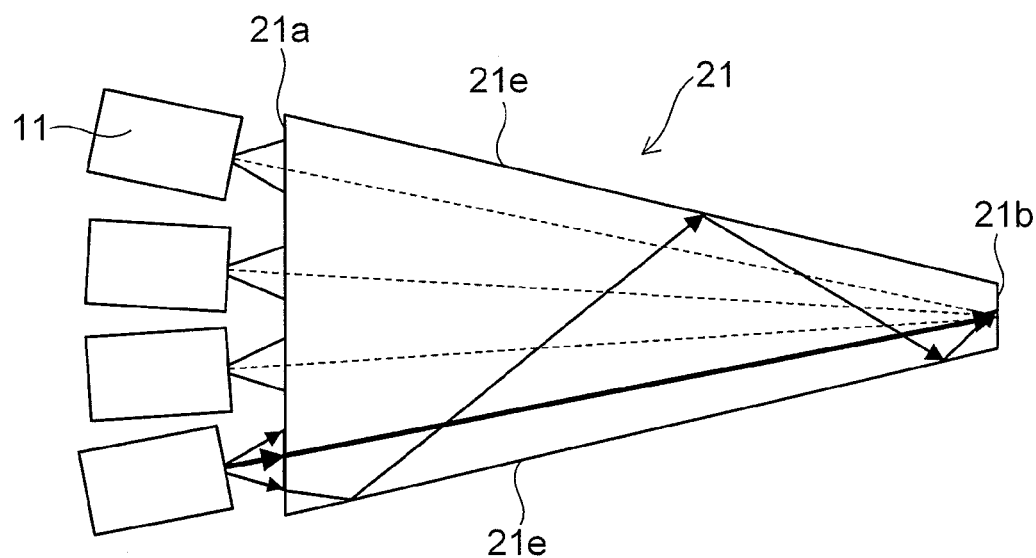
FIG. 13 is top view showing a modification of a disposition direction of a semiconductor laser device according to an embodiment of the present invention.
Figure 14:
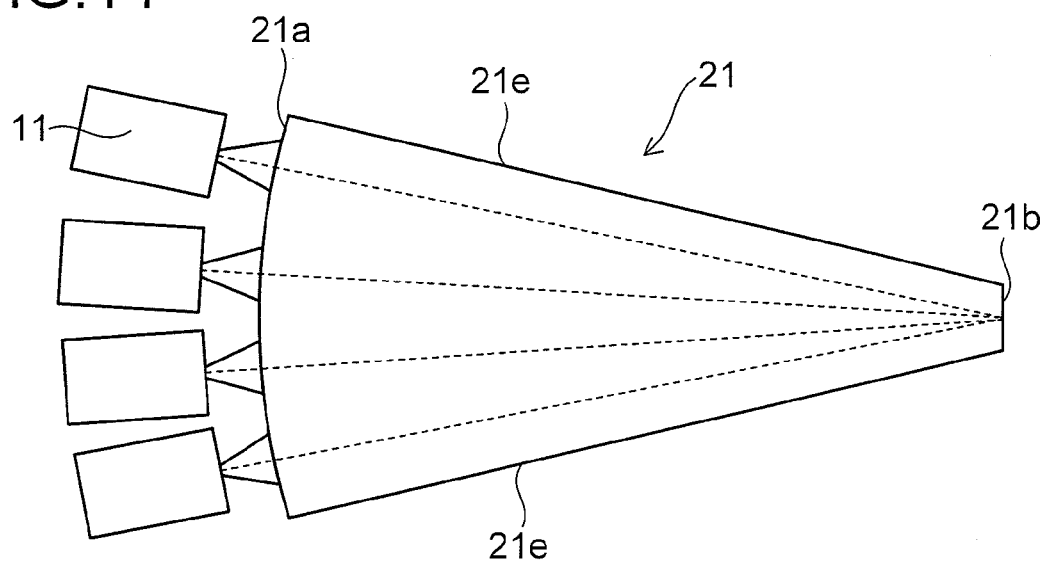
FIG. 14 is a top view showing a modification of a light collection member according to an embodiment of the present invention.

Besides, as shown in FIG. 13, when the semiconductor laser devices 11 are disposed in such a way that the output direction (optical-axis direction of the laser light) of the laser light faces toward a center of the light output surface 21*b* of the light collection member 21, it becomes more easily to meet the total reflection condition at the pair of side surfaces 21*e*, accordingly, it is especially effective. Here, in the case where the semiconductor laser devices 11 are disposed in such a way that the output direction of the laser light faces toward the center of the light output surface 21*b*, as shown in FIG. 14, the light incident surface 21*a* may be formed in such a way that the output direction of each laser light and the light incident surface 21*a* meet each other at right angles. Because of this, it is possible to alleviate the incident efficiency of the laser light into the light collection member 21 becoming low.

Figure 15:
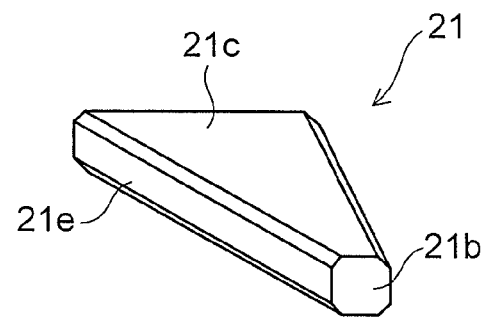
FIG. 15 is a perspective view showing a modification of a light collection member according to an embodiment of the present invention.
Figure 16:
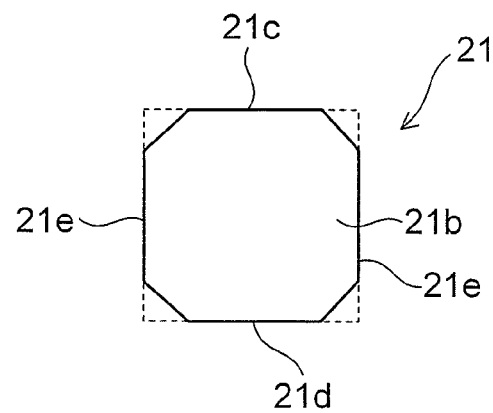
FIG. 16 is a front view showing a light output surface of the light collection member according to the embodiment in FIG. 15.
Figure 17:
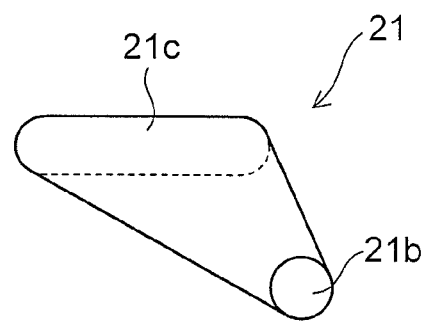
FIG. 17 is a perspective view showing a modification of a light collection member according to an embodiment of the present invention.

Besides, as shown in FIG. 15 to FIG. 17, edges of the light collection member 21 may be chamfered. In other words, a sectional surface perpendicular to the light guide direction of the light collection member 21 may be formed into a polygonal shape whose corners are chamfered. In this case, as shown in FIG. 15 and FIG. 16, the edges (corner portions of the sectional surface) of the light collection member 21 may be C-chamfered by C0.3 mm, for example. Besides, as shown in FIG. 17, the edges of the light collection member 21 may be R-chamfered to form the light output surface 21*b* into a substantially circular shape. As described above, when the sectional surface of the light collection member 21 perpendicular to the light guide direction is formed into the polygonal shape whose corner portions are chamfered, it is possible to alleviate the laser light scattering at the edges (corner portions of the sectional surface) of the light collection member 21. Because of this, it is possible to alleviate the laser light leaking from the light collection member 21, so that it is possible to improve laser light use efficiency. Here, the light guide direction of the light collection member 21 is a direction that extends from the center of the light incident surface 21*a* to the center of the light output surface 21*b*.

Figure 18:
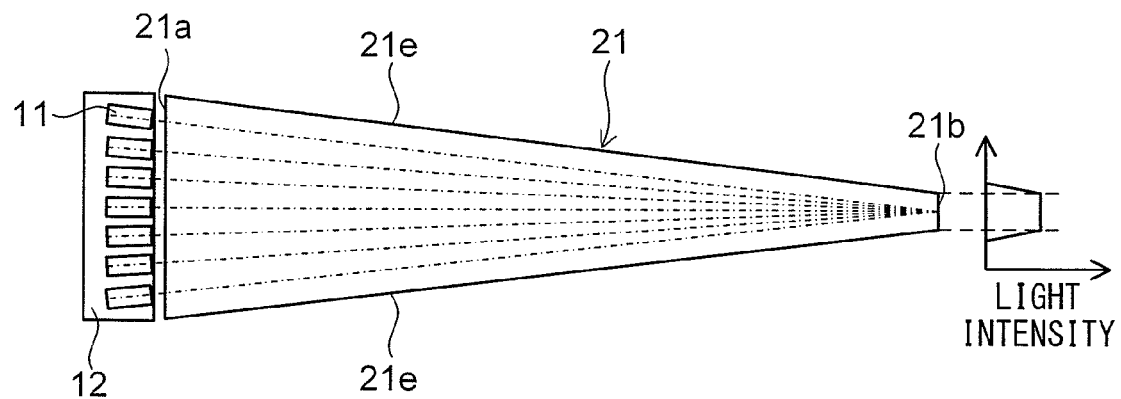
FIG. 18 is a view for describing a light intensity distribution of laser light at a light output surface of a light collection member according to an embodiment of the present invention.

And, the light intensity distribution of the laser light at the light output surface 21*b* of the light collection member 21 in the present embodiment becomes even as shown in FIG. 18. In other words, the light intensity distribution of the laser light output from the light output surface 21*b* is not a Gaussian distribution.

Figure 19:
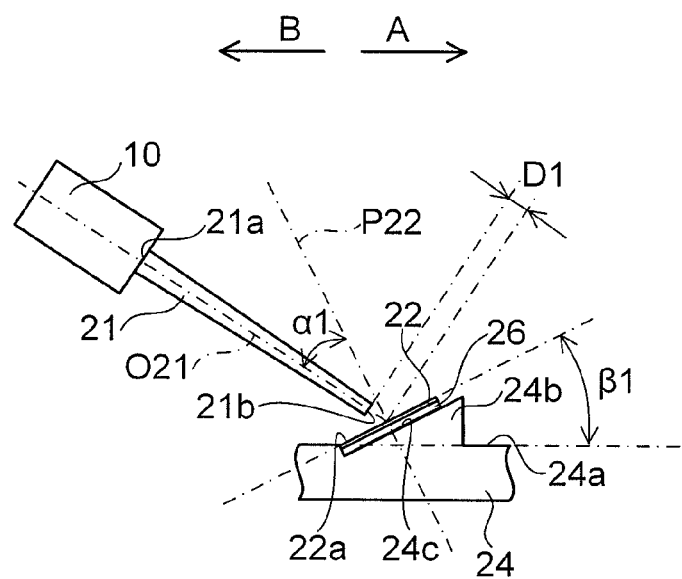
FIG. 19 is a view showing a structure of a peripheral portion of a fluorescent member according to an embodiment of the present invention.

Besides, as shown in FIG. 19, a central axis O21 of the light collection member 21 is inclined by an angle α1 (e.g., 30 degrees) of 10 degrees or more to 30 degrees or smaller with respect to a perpendicular line P22 of an illuminated surface 22*a* described later of the fluorescent member 22 in a B direction (opposite to the light projection direction (predetermined direction, the A direction)). Besides, a gap (space) is formed between the light output surface 21b of the light collection member 21 and the illuminated surface 22a of the fluorescent member 22. Specifically, the light output surface 21b of the light collection member 21 is disposed away from the illuminated surface 22a of the fluorescent member 22 by a distance D1 (predetermined distance) of about 0.3 mm or more to about 1.1 mm or smaller.

Here, the central axis O21 of the light collection member 21 is an axis that passes through the center of the light incident surface 21a and the center of the light output surface 21b, and is also an axis that is perpendicular to the light incident surface 21a and the light output surface 21b. Besides, the light projection direction is a direction that extends, for example, to the point desired to be illuminated most at 25 m in front of the light projection apparatus 1, that is, a direction that extends, for example, from a center of an opening portion of the reflection surface 23a to the maximum illuminance point at 25 m in front. Besides, in the present embodiment, the light projection direction is a direction (horizontal direction) parallel with an upper surface 24a described later of the mount member 24 and is also a direction perpendicular to an open surface (end surface in the A direction) of the reflection member 23.

The fluorescent member 22 has the illuminated surface 22a to which the laser light is directed. Besides, a rear surface (surface opposite to the illuminated surface 22a) of the fluorescent member 22 is in contact with the support plate 26 formed of aluminum. The fluorescent member 22 is deposited and formed on the support plate 26 by means of electrophoresis, for example. This support plate 26 has: a width (dimension across both ends) of about 10 mm; a length (dimension across both ends) of about 10 mm; and a thickness of about 1 mm. Besides, the fluorescent member 22 has: a width of about 10 mm; a length of about 10 mm; and an even thickness of about 0.1 mm. Because of this, the thickness of the fluorescent member 22 is one tenth of or smaller than the dimension across both ends of the fluorescent member 22. Besides, the thickness of the fluorescent member 22 is one tenth of or smaller than a spot diameter (e.g., 2 mm φ) of the laser light that is directed to the illuminated surface 22a of the fluorescent member 22. Besides, the illuminated surface 22a of the fluorescent member 22 is sufficiently larger than a spot region of the laser light.

Figure 20:
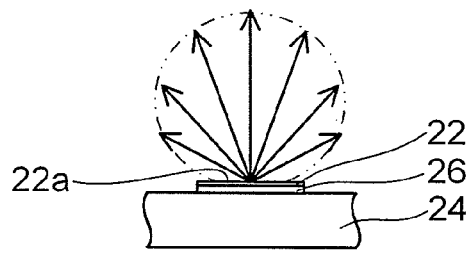
FIG. 20 is a view showing fluorescent light output from a fluorescent member according to an embodiment of the present invention.
Figure 21:
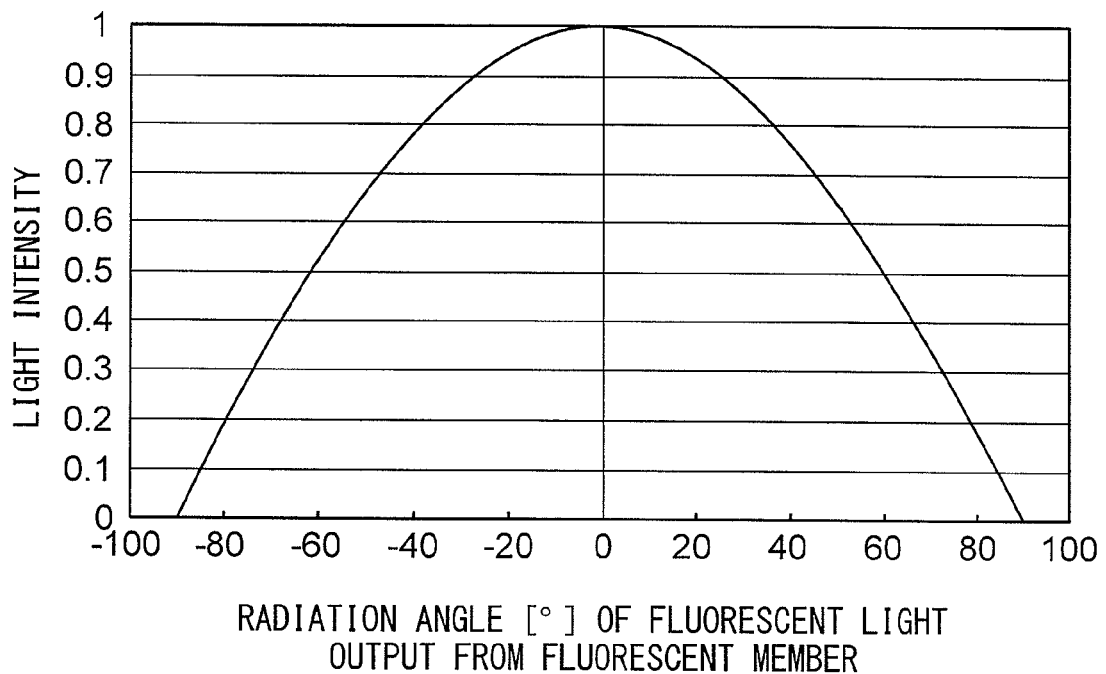
FIG. 21 is a view showing a light intensity distribution of fluorescent light output from a fluorescent member according to an embodiment of the present invention.
Figure 22:
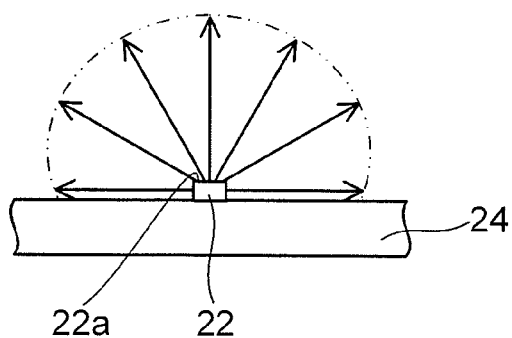
FIG. 22 is a view showing fluorescent light output from a fluorescent member that has a thickness larger than one tenth of a diameter.

Because of this, the fluorescent light output from the fluorescent member 22, as shown in FIG. 20, is output from chiefly the illuminated surface 22a, and the light intensity distribution of the fluorescent light output from the fluorescent member 22 becomes a Lambertian distribution as shown in FIG. 21. In other words, as for the fluorescent light output from the fluorescent member 22, the light intensity is highest in a perpendicular line direction of the illuminated surface 22a, and the light intensity in a direction parallel with the illuminated surface 22a becomes nearly zero. Here, when the thickness of the fluorescent member 22 is made larger than one tenth of the diameter (dimension across both ends) and the laser light is directed to a substantially entire surface of the illuminated surface 22a, the fluorescent light is output from the fluorescent member 22 in a state shown in FIG. 22. In other words, the fluorescent light is output from side surfaces as well of the fluorescent member 22, and the light intensity distribution of the fluorescent light output from the fluorescent member 22 does not become a Lambertian distribution.

Besides, the fluorescent member 22 is formed by using three kinds of fluorescent body particles that convert, for example, blue-purple light (excitation light) into red light, green light, and blue light, respectively. As the florescent body that converts the blue-purple light into the red light, there is $CaAlSiN_3$:Eu, for example. As the florescent body that converts the blue-purple light into the green light, there is β-SiAlON: Eu, for example. As the florescent body that converts the blue-purple light into the blue light, there is (Ba, Sr) $MgAl_{10}O_{17}$: Eu, for example. These fluorescent bodies are bound by means of an inorganic binder (silica, $TiO_2$ and the like). And, the red fluorescent light, the green fluorescent light, and the blue fluorescent light output from the fluorescent member 22 are mixed with one another to obtain white light. Here, the red light is light that has a central wavelength of about 640 nm, for example; the green light is light that has a central wavelength of about 520 nm, for example. Besides, the blue light is light that has a central wavelength of about 450 nm, for example.

Besides, the fluorescent member 22 contains the fluorescent body with a high density. Specifically, a volume occupation percentage of the fluorescent body in the fluorescent member 22 is about 90% or more. Besides, the fluorescent body is contained in the fluorescent member 22 at a ratio of about 90% by mass or more. Because of this, even in a case where the thickness of the fluorescent member 22 is small, it is possible to alleviate the laser light passing through the fluorescent member 22, and it is possible to efficiently convert the laser light into the fluorescent light. Besides, the laser light directed to the illuminated surface 22a of the fluorescent member 22 is easily converted into the fluorescent light near a surface of the illuminated surface 22a, and the fluorescent light is easily output from the illuminated surface 22a. Here, it is desirable that the above volume occupation percentage and the mass % are about 99% or more.

Besides, the fluorescent member 22, as shown in FIG. 1, is disposed in a region that includes a focal point F23 of the reflection surface 23a (first reflection surface) of the reflection member 23, and the center of the illuminated surface 22a of the fluorescent member 22 substantially agrees with the focal point F23 of the reflection surface 23a. Here, the fluorescent member 22 may be disposed near the focal point F23 of the reflection surface 23a of the reflection member 23.

Besides, the illuminated surface 22a of the fluorescent member 22, as shown in FIG. 19, is inclined in the B direction with respect to the light projection direction (A direction). In other words, the illuminated surface 22a of the fluorescent member 22 is inclined in a direction where the illuminated surface 22a becomes invisible when viewed from the open portion side of the reflection member 23.

Figure 23:
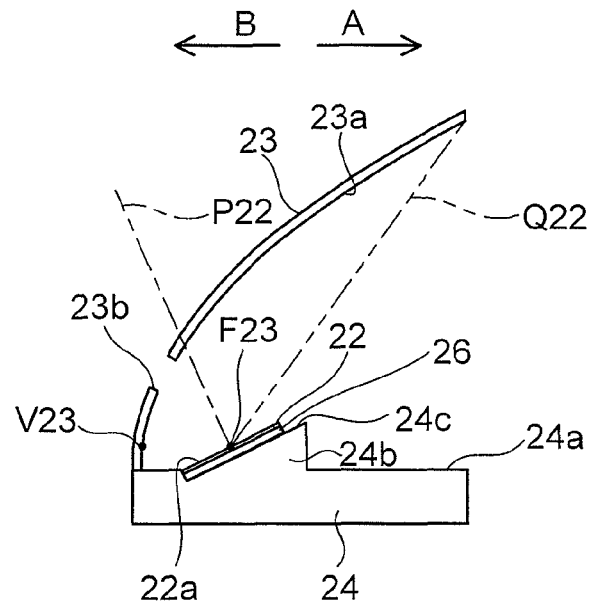
FIG. 23 is a sectional view for describing a structure of a reflection member according to an embodiment of the present invention.

Specifically, the illuminated surface 22a of the fluorescent member 22 is inclined in the B direction by an angle β1 (e.g., about 27 degrees) of more than 0 degrees to 30 degrees or smaller with respect to the light projection direction (A direction). Because of this, as shown in FIG. 23, a line Q22, which connects the center of the illuminated surface 22a and an end portion of the reflection surface 23a of the reflection member 23 in the light projection direction (A direction) with each other, is inclined in the light projection direction by 60 degrees or more (e.g., 63.9 degrees) with respect to the perpendicular line P22 of the illuminated surface 22a.

Figure 24:
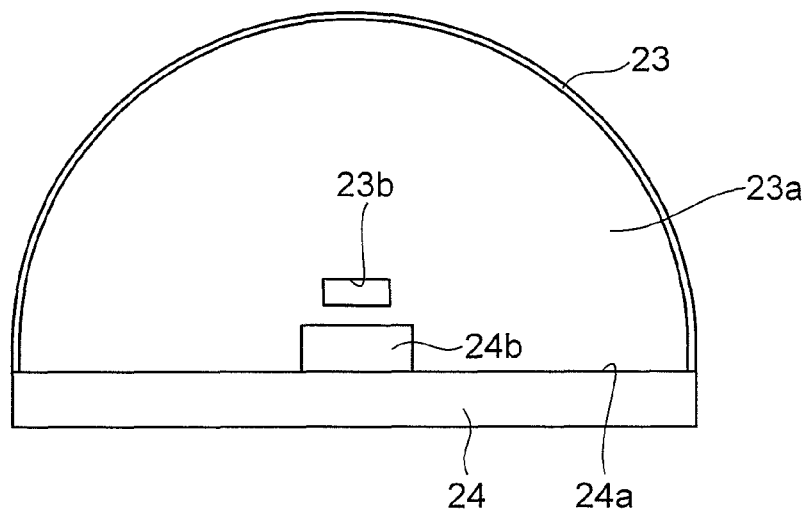
FIG. 24 is a front view for describing a structure of a reflection member according to an embodiment of the present invention.

The reflection surface 23a of the reflection member 23 is disposed so as to oppose the illuminated surface 22a of the fluorescent member 22. Besides, the reflection surface 23a is formed so as to include a portion of a parabolic surface, for example. Specifically, the reflection surface 23a is formed into a shape that is obtained by dividing a parabolic surface by means of a surface that meets (intersects) an axis at right angles which connects an apex V23 of the parabolic surface and the focal point F23 with each other and by dividing the parabolic surface by means of a surface that is parallel with an axis which connects the apex V23 and the focal point F23 with each other. And, the reflection surface 23a, as shown in FIG. 23 and FIG. 24, is formed into a substantially semicircular shape that has a depth (length in the B direction) of about 30 mm and a radius of about 30 mm when viewed from the light projection direction (the A direction).

Besides, the reflection surface 23a has a function to convert the light from the fluorescent member 22 into collimated light and reflect the collimated light in the predetermined direction (A direction). However, actually, the spot region (illuminated region) of the laser light on the illuminated surface 22a has a predetermined size; accordingly, the light output from the reflection member 23 is not complete collimated light; however, in the present specification, for the sake of simple description, there is a case where it is described that the collimated light is output from the reflection member 23.

Besides, a through-hole 23b is formed through a portion of the reflection member 23 in the B direction with respect to the center of the fluorescent member 22. A tip end portion of the light collection member 21 is inserted into this through-hole 23b.

Here, the reflection member 23 may be formed of a metal or may be formed by disposing a reflection film on an resin surface.

The mount member 24 is fixed to the reflection member 23. It is preferable that the upper surface 24a of this mount member 24 is formed so as to have a function to reflect light. The mount member 24 is formed of, for example, a metal such as Al, Cu or the like that have a good heat conductivity, and has a function to radiate heat generated by the fluorescent member 22. Besides, a mount portion 24b for fixing the fluorescent member 22 and the support plate 26 is formed integrally with the upper surface 24a of the mount member 24. Besides, as shown in FIG. 19, a mount surface 24c of the mount portion 24b is inclined in the B direction by an angle (=angle β1) of more than 0 degrees to 30 degrees or smaller with respect to the light projection direction (the A direction). Here, it is preferable that a heat radiation fin (not shown) is disposed on a lower surface of the mount member 24.

Besides, as shown in FIG. 1, at the opening portion (end portion in the A direction) of the reflection member 23, the filter member 25 is disposed, which blocks (absorbs or reflects) the excitation light (light that has a wavelength of about 405 nm), and transmits the fluorescent light (red light, green light, and blue light) that is converted in wavelength by the fluorescent member 22. Specifically, for example, it is possible to form the filter member 25 by using a glass material such as: the ITY-418 from Isuzu Glass Co. Ltd. that absorbs light which has a wavelength of about 418 nm or smaller and transmits light which has a wavelength of more than about 418 nm; the L42 from HOYA CORPORATION that absorbs light which has a wavelength of about 420 nm or smaller and transmits light which has a wavelength of more than about 420 nm, or the like.

Figure 25:
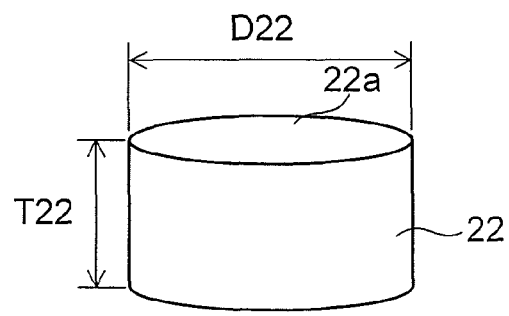
FIG. 25 is a view for describing an experiment that is performed to obtain an optimum thickness of a fluorescent member for a dimension across both ends of a fluorescent member.
Figures 26, 27:
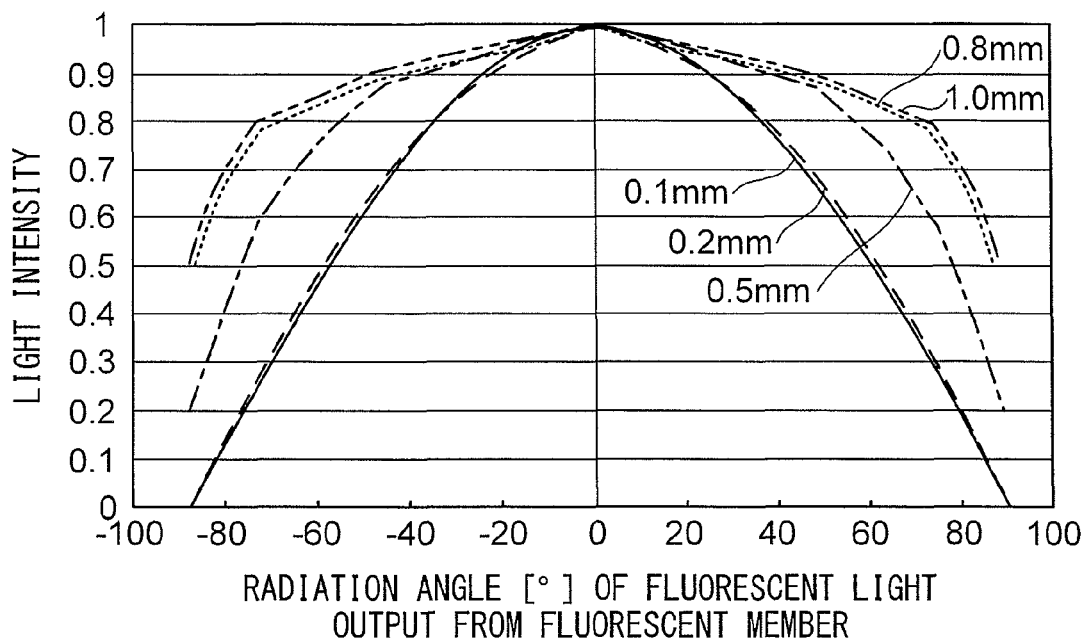
FIG. 26 is a view showing a relationship between a thickness of a fluorescent member and a light intensity distribution of fluorescent light output from a fluorescent member.
FIG. 27 is a view showing a percentage at which the amount of light output in a predetermined angle range with respect to a perpendicular line of an illuminated surface occupies in the total amount of light output from a fluorescent member.

Next, with reference to FIG. 25 and FIG. 26, there described a reason for that the thickness of the fluorescent member 22 is made to be one tenth of or smaller than the dimension across both ends of the fluorescent member 22. The inventors of the present application performed the following experiment to obtain an optimum thickness of the fluorescent member 22 for the dimension across both ends of the fluorescent member 22.

In this experiment, as shown in FIG. 25, the laser light was directed to the entire surface of the illuminated surface 22a of the cylinder-shaped fluorescent member 22, and the light intensity distribution of the fluorescent light output from the fluorescent member 22 was obtained by means of simulation.

Besides, in this experiment, to make clear a relationship between the shape of the fluorescent member 22 and the light intensity distribution of the fluorescent light, the light intensity distribution of a fluorescent member, in which the volume occupation percentage of the fluorescent body is about several dozens of parts percent by volume, was obtained. And, the light intensity distributions of five kinds of the fluorescent members 22, which have a diameter D22 of 2 mm and thicknesses T22 of 0.1 mm, 0.2 mm, 0.5 mm, 0.8 mm and 1.0 mm, respectively, were obtained. The results are shown in FIG. 26. Here, in FIG. 26, normalization is performed with the maximum value of the light intensity distribution of the fluorescent light output from each fluorescent member 22 set at 1.

As shown in FIG. 26, in cases where the thickness T22 of the fluorescent member 22 is 0.1 mm and 0.2 mm (cases where the thickness of the fluorescent member 22 is one tenth of or smaller than the dimension across both ends (diameter)), the light intensity distribution output from the fluorescent member 22 is a Lambertian distribution. On the other hand, in cases where the thickness T22 of the fluorescent member 22 is 0.5 mm, 0.8 mm and 1.0 mm (cases where the thickness of the fluorescent member 22 is one fourth of or more than the dimension across both ends (diameter)), the light intensity distribution output from the fluorescent member 22 is not a Lambertian distribution. Besides, when the thickness of the fluorescent member 22 is set at one tenth of or smaller than the dimension across both ends, directivity of the fluorescent light output from the fluorescent member 22 becomes high compared with the case where the thickness of the fluorescent member 22 is set at one fourth of or more than the dimension across both ends.

Here, the total light amounts (total luminous flux) of the fluorescent light output from the respective fluorescent members 22 are the same as one another; accordingly, when the thickness of the fluorescent member 22 is set at one tenth of or smaller than the dimension across both ends, the maximum value of the light intensity distribution becomes large compared with the case where the thickness of the fluorescent member 22 is set at one fourth of or more than the dimension across both ends. In other words, the fluorescent light amount output in the perpendicular line direction of the illuminated surface 22a of the fluorescent member 22 increases.

Based on the above results, the thickness of the fluorescent member 22 is set at one tenth of or smaller than the dimension across both ends.

Besides, it is because of the same reason that the illuminated surface 22a of the fluorescent member 22 is made sufficiently larger than the spot region of the laser light. In other words, as the illuminated surface 22a of the fluorescent member 22 is made larger than the spot region of the laser light, the light intensity distribution of the fluorescent light output from the illuminated surface 22a of the fluorescent member 22 becomes a Lambertian distribution. Because of this, in the present embodiment, the illuminated surface 22a of the fluorescent member 22 is made sufficiently larger than the spot region of the laser light in such a way that the light intensity distribution of the fluorescent light output from the illuminated surface 22a of the fluorescent member 22 becomes the Lambertian distribution.

Here, when the thickness of the fluorescent member 22 is formed to be one tenth of or smaller than the dimension across both ends or the illuminated surface 22a is formed to be sufficiently larger than the spot region of the laser light, it is possible to easily change the light intensity distribution of the fluorescent light output from the fluorescent member 22 to the Lambertian distribution.

Figure 28:
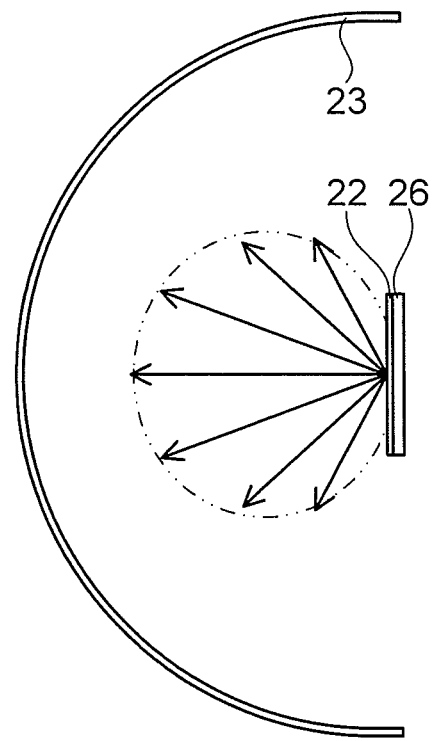
FIG. 28 is a view showing a structural example in which it is possible to reflect all fluorescent light output from a fluorescent member by means of a reflection member.
Figure 29:
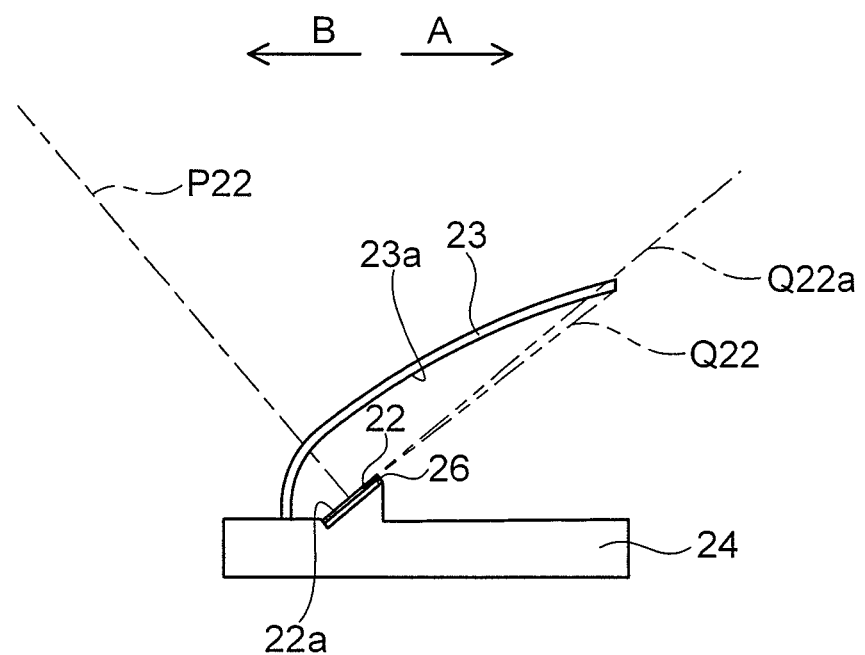
FIG. 29 is a view showing a state in which a reflection surface of a reflection member according to an embodiment of the present invention is extended in a light projection direction.

Next, with reference to FIG. 27 to FIG. 29, there described a reason for that the line Q22 (see FIG. 23), which connects the center of the illuminated surface 22a and the end portion of the reflection surface 23a of the reflection member 23 in the light projection direction with each other, is inclined by 60 degrees or more with respect to the perpendicular line P22 of the illuminated surface 22a.

In the case where the light intensity distribution of the fluorescent light output from the fluorescent member 22 is the Lambertian distribution (cases of 0.1 mm, and 0.2 mm in FIG. 21 and FIG. 26), as shown in FIG. 27, the total light amount (total luminous flux) of the fluorescent light is output in a range of −90 degrees or more to 90 degrees or smaller with respect to the perpendicular line P22 of the illuminated surface 22a of the fluorescent member 22. Because of this, if it is tried to reflect all of the fluorescent light by means of the reflection member 23, it is necessary to form the reflection member 23 so as to cover the range of −90 degrees or more to 90 degrees or smaller of the fluorescent member 22. As a structure to achieve this, a structure shown in FIG. 28 is conceivable. However, according to a study by the inventors of the present specification, it is hard to sufficiently radiate the heat generated by the fluorescent member 22 by means of the structure shown in FIG. 28, and it is hard to make the heat radiation characteristic and the fluorescent light use efficiency compatible with each other.

And, after a deep study, the inventors of the present specification found out that by forming the reflection surface 23a by means of substantially half of a parabolic surface, for example; disposing the fluorescent member 22 at the focal point F23 of the reflection surface 23a; making the thickness of the fluorescent member 23 small; mounting the fluorescent member 22 on the mount member 24 that has a good heat radiation characteristic; and inclining the illuminated surface 22a of the fluorescent member 22 with respect to the light projection direction (A direction), it is possible to dramatically improve the fluorescent light use efficiency while securing the heat radiation characteristic of the fluorescent member 22.

Here, as shown in FIG. 27, about 87% of the total light amount is confined in a range of −60 degrees or more to 60 degrees or smaller with respect to the perpendicular line P22 of the illuminated surface 22a; accordingly, if a structure is employed so as to reflect the fluorescent light in the range of −60 degrees or more to 60 degrees or smaller by means of the reflection surface 23a, it is sayable that it is sufficiently effective in practical use. Here, about 90% or more of the total light amount is confined in a range of about 63.9 degrees with respect to the perpendicular line P22 of the illuminated surface 22a.

Because of this, the reflection surface 23a is formed in such a way that the line Q22, which connects the center of the illuminated surface 22a and the end portion of the reflection surface 23a in the light projection direction with each other, is inclined by 60 degrees or more with respect to the perpendicular line P22 of the illuminated surface 22a. Here, as shown in FIG. 29, if the reflection surface 23a is extended in the light projection direction in such a way that the line Q22 is inclined by 90 degrees or more with respect to the perpendicular line P22, it is possible to reflect the total light amount output from the fluorescent member 22a by means of the reflection surface 23a. In other words, if the reflection surface 23a is extended more in the light projection direction beyond an extension line Q22a of the illuminated surface 22a, it is possible to reflect the total light amount output from the fluorescent member 22a by means of the reflection surface 23a.

Figure 30:
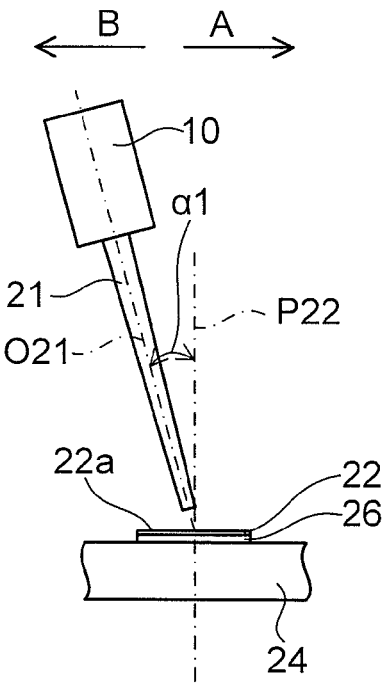
FIG. 30 is a view for describing an experiment that is performed to obtain an optimum inclination angle of a light collection member with respect to a perpendicular line of an illuminated surface of a fluorescent member.
Figure 31:
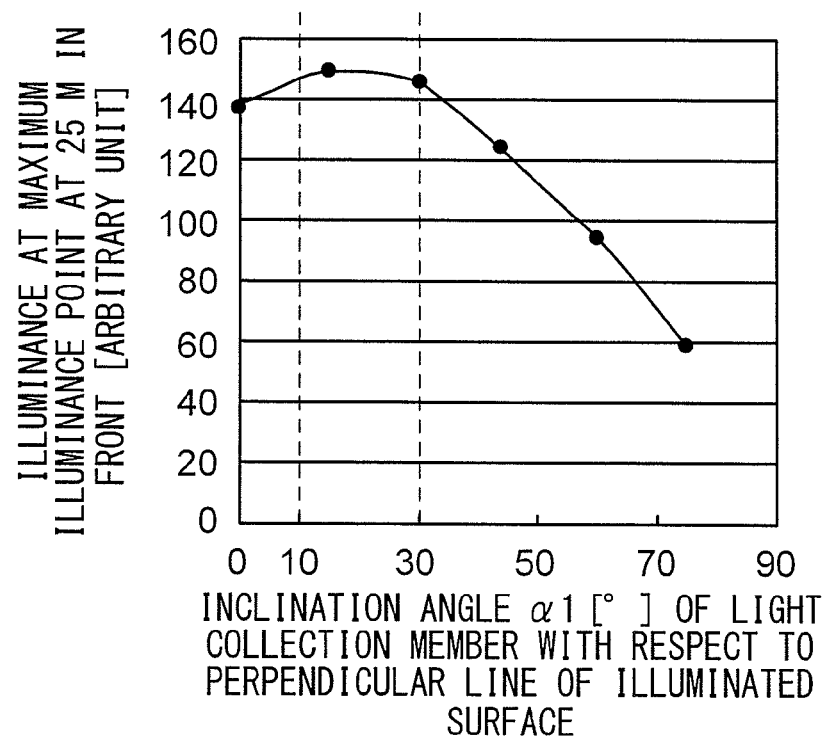
FIG. 31 is a view showing a relationship between: an inclination angle of a light collection member with respect to a perpendicular line of an illuminated surface of a fluorescent member; and illuminance at a maximum illuminance point.

Next, with reference to FIG. 30 and FIG. 31, there described a reason for that the central axis O21 of the light collection member 21 is inclined by 10 degrees or more to 30 degrees or smaller with respect to the perpendicular line P22 of the illuminated surface 22a of the fluorescent member 22. The inventors of the present application performed the following experiment to obtain an optimum inclination angle of the central axis O21 of the light collection member 21 with respect to the perpendicular line P22 of the illuminated surface 22a of the fluorescent member 22.

In this experiment, as shown in FIG. 30, the fluorescent member 22 was disposed so as to make the illuminated surface 22a parallel with the light projection direction (the A direction); the central axis O21 of the light collection member 21 was inclined by $\alpha 1$ (=0 degrees to 75 degrees) with respect to the perpendicular line P22 of the illuminated surface 22a; and the illuminance at the maximum illuminance point at 25 m in front of the light projection apparatus 1 was obtained by means of simulation. The results are shown in FIG. 31.

As shown in FIG. 31, when the inclination angle $\alpha 1$ of the central axis O21 of the light collection member 21 with respect to the perpendicular line P22 of the illuminated surface 22a is about 10 degrees to about 30 degrees, the illuminance at the maximum illuminance point at 25 m in front of the light projection apparatus 1 becomes highest. It is conceivable that this is because of the following reason. As the inclination angle $\alpha 1$ becomes larger than about 30 degrees, the spot region of the laser light on the illuminated surface 22a becomes larger. Because of this, light, which is excited and emitted from a position deviated from the focal point F23 of the reflection surface 23a, increases, and light projected as the collimated light decreases. Because of this, it is conceivable that the illuminance at the maximum illuminance point at 25 m in front of the light projection apparatus 1 becomes low. On the other hand, as the inclination angle $\alpha 1$ becomes smaller (approaches 0 degrees) than about 10 degrees, of the light output from the fluorescent member 22, light entering (returning to) the light collection member 21 increases, and light reaching the reflection surface 23a decreases. Because of this, it is conceivable that the light projected from the reflection surface 23a decreases and the illuminance at the maximum illuminance point at 25 m in front of the light projection apparatus 1 becomes low. Based on the above results, the central axis O21 of the light collection member 21 is inclined by 10 degrees or more to 30 degrees or smaller with respect to the perpendicular line P22 of the illuminated surface 22a of the fluorescent member 22.

Here, it is because of the following reason that the central axis O21 of the light collection member 21 is inclined in the B direction (opposite to the light projection direction) with respect to the perpendicular line P22 of the illuminated surface 22a. If the central axis O21 of the light collection member 21 is inclined in the A direction with respect to the perpendicular line P22 of the illuminated surface 22a, the light collection member 21 is disposed on an optical path of the light reflected by the reflection surface 23a. Because of this, part of the light reflected by the reflection surface 23a enters the light collection member 21, whereby the light use efficiency becomes low.

Figure 32:
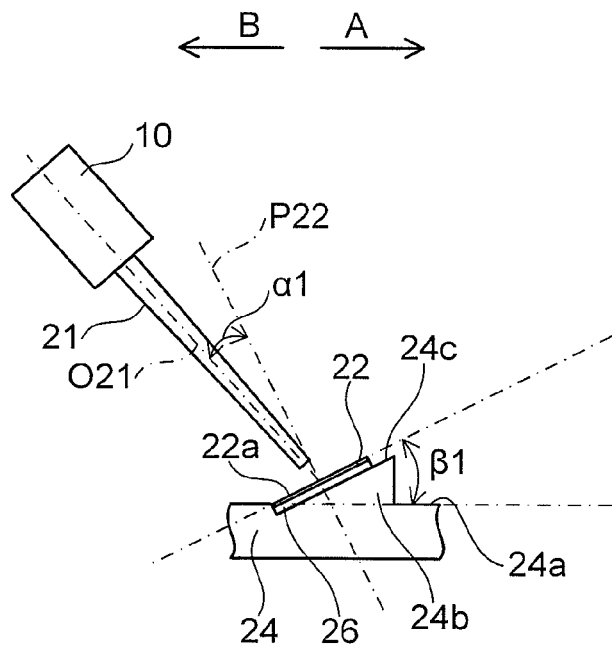
FIG. 32 is a view for describing an experiment that is performed to obtain an optimum inclination angle of an illuminated surface of a fluorescent member with respect to a light projection direction.
Figure 33:
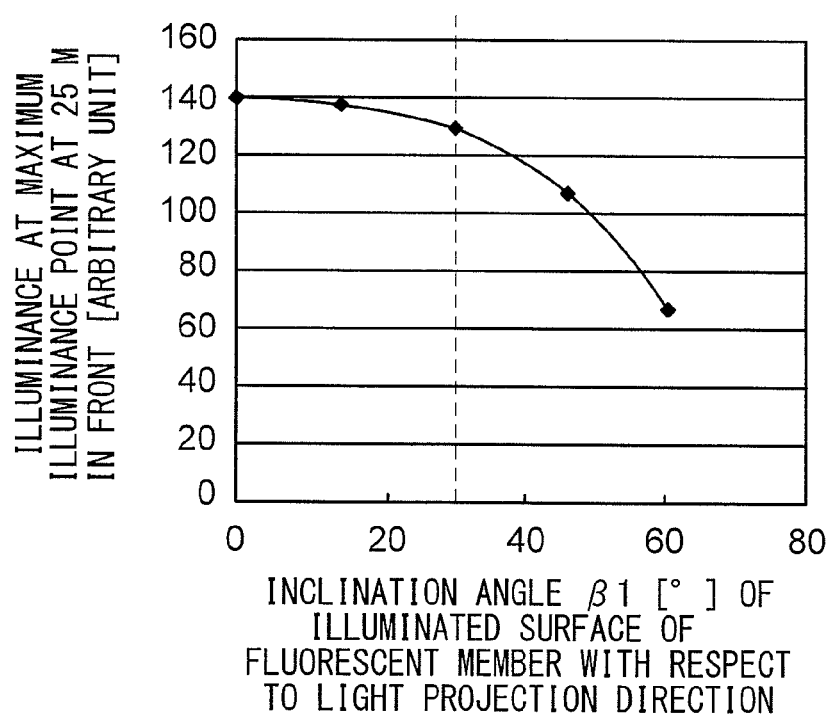
FIG. 33 is a view showing a relationship between: an inclination angle of an illuminated surface of a fluorescent member with respect to a light projection direction; and illuminance at a maximum illuminance point.

Next, with reference to FIG. 32 and FIG. 33, there described a reason for that the illuminated surface 22a of the fluorescent member 22 is inclined by the angle of more than 0 degrees to 30 degrees or smaller with respect to the light projection direction (A direction). The inventors of the present application performed the following experiment to obtain an optimum inclination angle of the illuminated surface 22a of the fluorescent member 22 with respect to the light projection direction (A direction).

In this experiment, as shown in FIG. 32, the inclination angle α1 of the light collection member 21 was set at 75 degrees; the illuminated surface 22a of the fluorescent member 22 was inclined by the angle β1 (=0 degrees to 60 degrees) with respect to the light projection direction (A direction); and the illuminance at the maximum illuminance point at 25 m in front of the light projection apparatus 1 was obtained by means of simulation. The results are shown in FIG. 33.

As shown in FIG. 33, when the inclination angle β1 of the illuminated surface 22a of the fluorescent member 22 with respect to the light projection direction (A direction) is 0 degrees to about 30 degrees or smaller, the illuminance at the maximum illuminance point at 25 m in front of the light projection apparatus 1 becomes highest. Specifically, when the inclination angle β1 is 0 degrees, the illuminance at the maximum illuminance point becomes highest; as the inclination angle β1 becomes larger, the illuminance at the maximum illuminance point tends to become smaller. Besides, in a case where the inclination angle β1 is in a range of about 30 degrees or smaller, an illuminance drop is curbed to about 10% compared with a case where the inclination angle β1 is 0 degrees.

The following is conceivable as a reason for that as the inclination angle β1 becomes larger, the illuminance at the maximum illuminance point becomes low. The reflection surface 23a is large in curvature near the apex V23 (see FIG. 23), and the curvature becomes smaller toward the opening portion. In a case where the spot region of the laser light is regardable as a dot, the light reflected near the apex V23 of the reflection surface 23a and also the light reflected near the opening portion become the collimated light. However, actually, the spot region has a size (e.g., 2 mm φ); light is also output from a position slightly deviated from the focal point F23 of the reflection surface 23a and is reflected by the reflection surface 23a. At this time, the curvature near the apex V23 is large; accordingly, the light reflected near the apex V23 is more unlikely to become the collimated light than the light reflected near the opening portion, and unlikely to reach the maximum illuminance point. And, as the inclination angle β1 becomes larger, the light reflected near the opening portion of the reflection surface 23a decreases, so that it is conceivable that the illuminance at the maximum illuminance point becomes low.

However, as the inclination angle β1 becomes smaller, light, which is directly output to the outside without being reflected by the reflection member 22, increases. In other words, light controllable by the reflection member 22 decreases. Because of this, the illuminance in a predetermined area in front of the light projection apparatus 1 becomes low as a whole. Based on the above results, it is preferable that the inclination angle β1 is larger than 0 degrees and 30 degrees or smaller.

Figure 34:
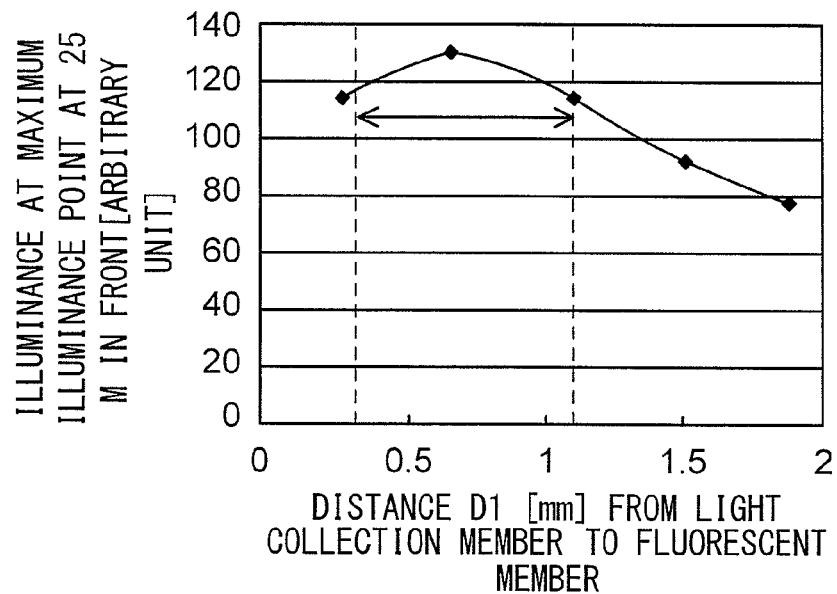
FIG. 34 is a view showing a relationship between: a distance from a light output surface of a light collection member to an illuminated surface of a fluorescent member; and illuminance at a maximum illuminance point.

Next, with reference to FIG. 19 and FIG. 34, there described a reason for that the light output surface 21b of the light collection member 21 is disposed away from the illuminated surface 22a of the fluorescent member 22 by the distance of about 0.3 mm or more to about 1.1 mm or smaller. The inventors of the present application performed the following experiment to obtain an optimum distance from the light output surface 21b of the light collection member 21 to the illuminated surface 22a of the fluorescent member 22.

In this experiment, as shown in FIG. 19, the inclination angle α1 of the light collection member 21 was set at 30 degrees; the inclination angle β1 of the fluorescent member 22 was set at 27 degrees; and the illuminance at the maximum illuminance point at 25 m in front of the light projection apparatus 1 was obtained by means of simulation. The results are shown in FIG. 34.

As shown in FIG. 34, when the distance D1 from the light output surface 21b of the light collection member 21 to the illuminated surface 22a of the fluorescent member 22 is about 0.3 mm or more to about 1.1 mm or smaller, the illuminance at the maximum illuminance point is highest. Besides, when the distance D1 is in the range of about 0.3 mm or more to about 1.1 mm or smaller, the illuminance drop is curbed to about 10%.

The following is conceivable as a reason for that when the distance D1 is smaller than about 0.3 mm and when larger than about 1.1 mm, the illuminance at the maximum illuminance point becomes low. As the distance D1 becomes smaller, of the light output from the fluorescent member 22, light entering (returning to) the light collection member 21 increases, and light reaching the reflection surface 23a decreases. Because of this, it is conceivable that the light projected from the reflection surface 23a decreases and the illuminance at the maximum illuminance point at 25 m in front of the light projection apparatus 1 becomes low. Besides, as the distance D1 becomes larger, the spot region of the laser light on the illuminated surface 22a becomes larger. Because of this, light, which is excited and emitted from a point deviated from the focal point F23 of the reflection surface 23a, increases, and light projected as the collimated light decreases. Because of this, it is conceivable that the illuminance at the maximum illuminance point at 25 m in front of the light projection apparatus 1 becomes low. Based on the above results, the light output surface 21b of the light collection member 21 is disposed away from the illuminated surface 22a of the fluorescent member 22 by the distance of about 0.3 mm or more to about 1.1 mm or smaller.

In the present embodiment, as described above, by disposing the fluorescent member 22 that outputs the fluorescent light from chiefly the illuminated surface 22a, it is possible to reflect most part of the light (fluorescent light) output from the fluorescent member 22 by means of the reflection member 23. In other words, it is possible to control the most part of the light output from the fluorescent member 22 by means of the reflection member 23. Because of this, it is possible to increase the light that reaches a desired region, so that it is possible to efficiently illuminate the desired region. As a result of this, it is possible to improve the light (fluorescent light) use efficiency.

Besides, as described above, the illuminated surface 22a of the fluorescent member 22 is inclined in the B direction with respect to the predetermined direction (A direction). In other words, the illuminated surface 22a of the fluorescent member 22 is inclined in the predetermined direction (A direction) in such a way that the illuminated surface 22a faces in the direction opposite to the light projection direction (A direction). Because of this, it is possible to alleviate the light output from the fluorescent member 22 exiting directly to the outside without being reflected by the reflection member 23. In other words, it is possible to decrease the light uncontrollable by the reflection member 23. Because of this, it is possible to alleviate the light which reaches the desired region decreasing, so that it is possible to efficiently illuminate the desired region. Besides, it is possible to alleviate the illuminated surface 22a (spot region) of the fluorescent member 22 being visible from the outside of the light projection unit 20, so that it is possible to alleviate glare light reaching walking people, preceding cars, oncoming cars and the like.

Besides, as described above, by inclining the mount surface 24c in the B direction with respect to the predetermined direction (A direction), even if the thicknesses of the fluorescent member 22 and the support plate 26 are even, it is possible to easily incline the illuminated surface 22a of the fluorescent member 22 in the B direction with respect to the predetermined direction (A direction). Besides, the thicknesses of the fluorescent member 22 and the support plate 26 are formed even, so that it is possible to easily produce the fluorescent member 22 and the support plate 26.

Besides, as described above, by setting the volume occupation percentage of the fluorescent body in the fluorescent member 22 at 90% or more, even in a case where the thickness of the fluorescent member 22 is small, it is possible to alleviate the laser light passing through the fluorescent member 22, and it is possible to efficiently convert the laser light into the fluorescent light. Besides, the laser light directed to the fluorescent member 22 becomes easy to be converted into the fluorescent light near the surface of the illuminated surface 22a of the fluorescent member 22. Because of this, it is possible to easily output the fluorescent light from chiefly the illuminated surface 22a of the fluorescent member 22.

Besides, as described above, the light intensity distribution of the fluorescent light output from the fluorescent member 22 is the Lambertian distribution. Because of this, as for the light output from the fluorescent member 22, the light intensity is highest in the perpendicular line direction of the illuminated surface 22a, and the light intensity in the direction parallel with the illuminated surface 22a becomes nearly zero. Because of this, it is possible to alleviate the light output from the fluorescent member 22 exiting directly to the outside without being reflected by the reflection member 23. In other words, it is possible to more decrease the light uncontrollable by the reflection member, and possible to more alleviate the light which reaches the desired region decreasing.

Besides, as described above, the thickness of the fluorescent member 22 is one tenth of or smaller than the dimension (width, length) across both ends of the illuminated surface 22a. Besides, the illuminated surface 22a of the fluorescent member 22 is sufficiently larger than the spot region of the laser light that is directed to the illuminated surface 22a. Because of this, it is possible to easily change the light intensity distribution of the fluorescent light output from the fluorescent member 22 into the Lambertian distribution.

Besides, as described above, the light collection member 21 is disposed, which includes: the light incident surface 21a from which the laser light is input; the light output surface 21b which has the area smaller than the light incident surface 21a and from which the laser light is output; the upper surface 21c, the lower surface 21d and the pair of side surfaces 21e that reflect the light entering from the light incident surface 21a and guide the light to the light output surface 21b. Because of this, the laser light entering from the light incident surface 21a travels in the light collection member 21 being reflected by the upper surface 21c, the lower surface 21d and the pair of side surfaces 21e, and is output from the light output surface 21b with the evened light intensity distribution. In other words, the light intensity distribution of the laser output from the light output surface 21b is not a Gaussian distribution. Because of this, it is possible to alleviate a portion, which becomes too high in light intensity, occurring in the illuminated surface 22a of the fluorescent member 22. Because of this, it is possible to alleviate the fluorescent body and the binder contained in the fluorescent member 22 deteriorating because of the heat and to alleviate the fluorescent body and the binder performing chemical reaction because of the light and deteriorating.

Besides, this light collection member 21 does not have a focal point (light collection point) unlike a light collection lens and the like. In other words, the laser light output from the light collection member 21 is not collected onto one point. Because of this, even in a case where a positional deviation occurs in the semiconductor laser device 11, the light collection member 21 or the fluorescent member 22 because of vibration and time-dependent change, it is possible to alleviate the light intensity dramatically changing in the illuminated surface 22a of the fluorescent member 22. Because of this, it is possible to alleviate a portion, which becomes too high in light intensity, occurring in the fluorescent member 22. Besides, even in a case where the semiconductor laser device 11 is deviated with respect to the light collection member 21, the spot position (illumination position) of the laser light on the illuminated surface 22a hardly changes. Because of this, it is unnecessary to position the semiconductor laser device 11 with respect to the light collection member 21 with high accuracy, so that it is possible to easily perform assembly of the light projection apparatus 1.

Besides, the light output surface 21b of the light collection member 21 has the area smaller than the light incident surface 21a, so that the laser light is collected and output from the light output surface 21b. Because of this, it is possible to narrow the spot region of the laser light in the illuminated surface 22a of the fluorescent member 22, so that it is possible to narrow a light emission region of the fluorescent member 22. Because of this, it is possible to efficiently illuminate the desired region.

Besides, by disposing the light output surface 21b of the light collection member 21 away from the illuminated surface 22a of the fluorescent member 22 by the predetermined distance D1, it is possible to alleviated the light output from the illuminated surface 22a of the fluorescent member 22 entering (returning to) from the light output surface 21b of the light collection member 21. Because of this, it is possible to alleviate the light use efficiency becoming low.

Besides, as described above, the light collection member 21 is inclined with respect to the perpendicular line P22 of the illuminated surface 22a of the fluorescent member 22. The light output from the fluorescent member 22 is highest in light intensity in the perpendicular line direction of the illuminated surface 22a; accordingly, by inclining the light collection member 21 with respect to the perpendicular line P22 of the illuminated surface 22a, it is possible to more alleviate the light output from the illuminated surface 22a of the fluorescent member 22 entering from the light output surface 21b of the light collection member 21. Because of this, it is possible to alleviate the light use efficiency becoming low.

Besides, as described above, the light collection member 21 is inclined in the B direction with respect to the perpendicular line P22 of the illuminated surface 22a of the fluorescent member 22. Because of this, it is possible to alleviate the light, which is reflected by the reflection member 23 to travel in the predetermined direction (A direction), entering the light collection member 21. In other words, it is possible to alleviate the light collection member 21 being disposed in the optical path of the light reflected by the reflection member 23. Because of this, it is possible to more alleviate the light use efficiency becoming low.

Besides, by using the above light collection member 21, it is possible to easily collect the laser light output from the plurality of semiconductor laser devices 11. Because of this, it is especially effective to use the above light collection member 21 in a case where the plurality of semiconductor laser devices 11 are used as a light source.

Besides, as described above, by mounting the florescent member 22 on the metallic mount member 24, it is possible to efficiently radiate the heat generated by the fluorescent member 22. Because of this, it is possible to alleviate the fluorescent member 22 rising to a high temperature, so that it is possible to alleviate the fluorescent member 22 being deteriorated by the heat and the light emission efficiency of the fluorescent member 22 becoming low.

Besides, as described above, the reflection surface 23a is formed so as to include a portion of the parabolic surface. Because of this, by positioning the fluorescent member 22 at the focal point F23 of the reflection surface 23a, it is possible to easily emit the light (illumination light) output from the light projection unit 20 as the collimated light.

Besides, as described above, the reflection surface 23a is formed into the shape that is obtained by dividing the parabolic surface by means of the surface that intersects the axis which connects the focal point F23 of the parabolic surface and the apex V23 of the parabolic surface with each other and by dividing the parabolic surface by means of the surface that is parallel with the axis which connects the focal point F23 and the apex V23 with each other. Because of this, it is possible to achieve size reductions of the reflection member 23 and the light projection unit 20.

Besides, as described above, the illuminated surface 22a of the fluorescent member 22 is inclined by the angle β1 of more than 0 degrees to 30 degrees or smaller with respect to the predetermined direction (A direction). Because of this, it is possible to alleviate the illuminance of the desired region becoming low as a whole alleviating the illuminance at the maximum illuminance point in the desired region becoming low.

Besides, as described above, the line Q22, which connects the center of the illuminated surface 22a of the fluorescent member 22 and the end portion of the reflection surface 23a in the A direction with each other, is inclined in the A direction by 60 degrees or more with respect to the perpendicular line P22 of the illuminated surface 22a. Because of this, it is possible to reflect more fluorescent light by means of the reflection surface 23a, and to more improve the fluorescent light use efficiency. Here, by forming the reflection surface 23a in such a way that the line Q22 has an angle of 90 degrees or more with respect to the perpendicular line P22, it is possible to reflect all of the fluorescent light by means of the reflection surface 23a. In this case, the illuminated surface 22a is invisible from the outside of the light projection unit 20, so that it is possible to alleviate glare light reaching walking people, preceding cars, oncoming cars and the like.

Besides, as described above, the light output surface 21b of the light collection member 21 is disposed away from the illuminated surface 22a of the fluorescent member 22 by the distance D1 of about 0.3 mm or more to about 1.1 mm or smaller. Because of this, it is possible to increase the illuminance at the maximum illuminance point in the desired region.

Besides, as described above, the light collection member 21 is inclined by 10 degrees or more to 30 degrees or smaller with respect to the perpendicular line P22 of the illuminated surface 22a of the fluorescent member 22. Because of this, it is possible to increase the illuminance at the maximum illuminance point in the desired region.

Here, it should be considered that the embodiments disclosed this time are examples in all respects and are not limiting. The scope of the present invention is not indicated by the above description of the embodiments but by the claims, and all modifications within the scope of the claims and the meaning equivalent to the claims are covered.

For example, in the above embodiment, the example is described, in which the light projection apparatus according to the present invention is used for a head light of an automobile; however, the present invention is not limited to this. The light projection apparatus according to the present invention may be used for a head light of an airplane, a ship, a robot, a bike, a bicycle, or other mobile bodies.

Besides, in the above embodiment, the light projection apparatus according to the present invention is applied to the head light; however, the present invention is not limited to this. The light projection apparatus according to the present invention may be applied to a downlight, a spot light, or other light projection apparatuses.

Besides, in the above embodiment, the example is described, in which the example is described, in which the excitation light is converted into the visible light; however, the present invention is not limited to this, and the excitation light may be converted into light other than the visible light. For example, in a case where the excitation light is converted into infrared light, the present invention is applicable to a night illumination apparatus of a security CCD camera and the like.

Besides, in the above embodiment, the example is described, in which the excitation light source (semiconductor laser device) and the fluorescent member are structured in such a way that the white light is output; however, the present invention is not limited to this. The excitation light source and the fluorescent member may be structured in such a way that light other than the white light is output.

Besides, in the above embodiment, the example is described, in which the semiconductor laser device is used as the laser generator that outputs the laser light; however, the present invention is not limited to this, and a laser generator other than the semiconductor laser device may be used.

Besides, the numerical values shown in the above embodiment are examples, and each numerical value is not limited.

Figure 35:
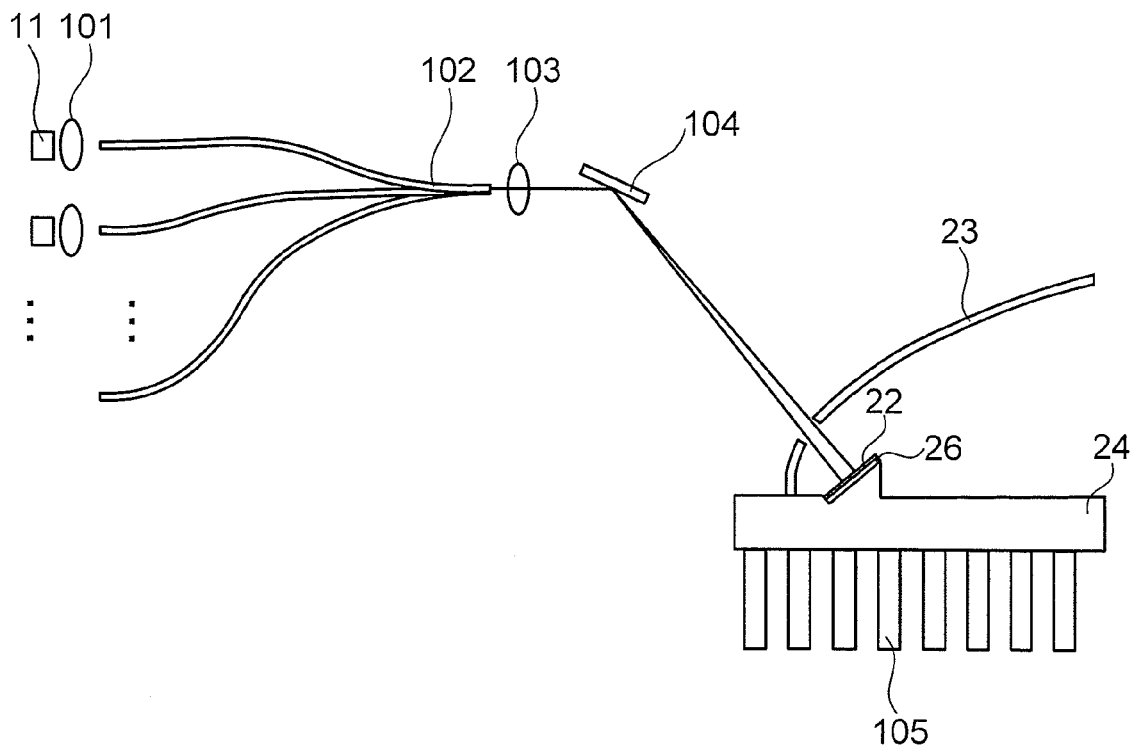
FIG. 35 is a view showing a structure of a light projection apparatus according to a first modification of the present invention.
Figure 36:
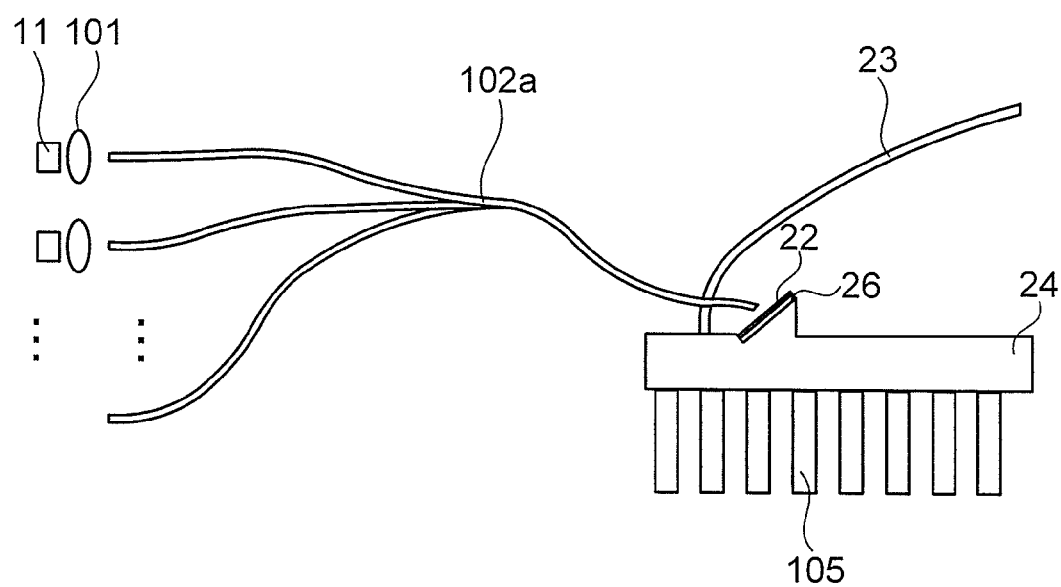
FIG. 36 is a view showing a structure of a light projection apparatus according to a second modification of the present invention.

Besides, in the above embodiment, the example is described, in which the laser light output from the semiconductor laser device is collected by the light collection member and directed to the fluorescent member; however, the present invention is not limited to this. For example, as in a light projection apparatus according to a first modification of the present invention shown in FIG. 35, the laser light output from the semiconductor laser device 11 may be directed to the fluorescent member 22 by means of a lens 101, a bundled optical fiber 102, a light collection lens 103, and a reflection mirror 104. Besides, as in a light projection apparatus according to a second modification of the present invention shown in FIG. 36, the laser light output from the semiconductor laser device 11 may be directed to the fluorescent member 22 by means of the lens 101 and a bundled optical fiber 102a. Besides, as shown in FIG. 35 and FIG. 36, a plurality of heat radiation fins 105 may be disposed on the lower surface of the mount member 24.

Besides, it is possible to suitably change the central wavelength of the laser light output from the semiconductor laser device in the above embodiment and the kind of the fluorescent body that constitutes the fluorescent member. For example, the white light may be obtained by using a semiconductor laser device that outputs blue laser light which has the central wavelength of about 450 nm and a fluorescent body that converts part of the blue laser light into yellow light. In this case, the filter member for blocking the excitation light may not be disposed. Here, as the fluorescent body that converts part of the blue laser light into the yellow light, for example, there are $(Y_{1-x-y}Gd_xCe_y)_3Al_5O_{12}$ (0.1≤x≤0.55, 0.01≤y≤0.4) and the like. Besides, not being limited to this, the central wavelength of the laser light output from the semiconductor laser device may be arbitrarily selected from a range of ultraviolet light to visible light.

Besides, in the above embodiment, the example is described, in which the reflection surface of the reflection member is formed of a portion of the parabolic surface; however, the present invention is not limited to this, and the reflection surface may be formed of a portion of an elliptic surface. In this case, by positioning the fluorescent member at the focal point of the reflection surface, it is possible to easily collect the light output from the light projection unit. Besides, the reflection surface may be formed of a multi-reflector that includes many curved surfaces (e.g., parabolic surfaces), a free curved-surface reflector in which many minute surfaces are consecutively disposed, or the like.

Besides, in the above embodiment, the example is described, in which the reflection member and the mount member are separately disposed; however, the present invention is not limited to this, and the reflection member and the mount member may be integrally formed with each other.

Besides, in the above embodiment, the example is described, in which the plurality of semiconductor laser devices are used as the excitation light source; however, the present invention is not limited to this. As the excitation light source, one semiconductor laser device may be used. Besides, as the excitation light source, a so-called semiconductor laser array including a plurality of light emitting portions may be used.

Besides, in the above embodiment, the example is described, in which the light collection member is fixed to the laser generation apparatus; however, the present invention is not limited to this. The light collection member may be fixed to the reflection member, the mount member, the support member, or the fluorescent member.

Besides, in the above embodiment, the example is described, in which the gap (space) is formed between the light output surface of the light collection member and the illuminated surface of the fluorescent member; however, the present invention is not limited to this. Resin, glass or the like may be disposed between the light output surface of the light collection member and the illuminated surface of the fluorescent member, or the inside of the reflection surface of the reflection member may be filled with resin, glass or the like.

Besides, in the above embodiment, the example is described, in which the laser light is converted into the fluorescent light near the surface of the illuminated surface of the fluorescent member and output from the illuminated surface. In other words, the example is described, in the laser light and the fluorescent light do not reach the rear side of the fluorescent member; however, the present invention is not limited to this. A surface of the support plate, with which the rear surface of the fluorescent member comes into contact, may be formed of the reflection surface in such a way that the fluorescent light is not substantially output from the rear surface of the fluorescent member. In this case, the fluorescent body may not have as a high density as in the above embodiment. However, the light emission efficiency is high when the laser light does not reach the rear side of the fluorescent member and is converted into the fluorescent light near the surface of the illuminated surface, so that it is preferable that the fluorescent body has a high density.

Besides, in the above embodiment, the example is described, in which the fluorescent member is formed on the support plate; however, the present invention is not limited to this. For example, the fluorescent member may be formed directly on the mount portion of the mount member. Besides, for example, the support plate and the mount portion may not be disposed, and a portion equivalent to the support plate and the mount portion may be formed of the fluorescent member. However, in this case, the thickness of the fluorescent member becomes large and the heat radiation characteristic becomes low, so that it is preferable to dispose the mount portion to make the thickness of the fluorescent member small.

Besides, in the above embodiment, the example is described, in which the light collection member is inclined in the direction opposite to the light projection direction with respect to the perpendicular line of the illuminated surface of the fluorescent member; however, the present invention is not limited to this. The light collection member may be inclined in another direction with respect to the perpendicular line of the illuminated surface of the fluorescent member.

Besides, in the above embodiment, the example is described, in which the illuminated surface of the fluorescent member has the substantially square shape or substantially circular shape; however, the present invention is not limited to this. The illuminated surface of the fluorescent member may have, for example, an elliptic shape, a rectangular shape, or a polygonal shape.

Besides, in the above embodiment, the example is described, in which the light output surface of the light collection member is formed of the flat surface; however, the present invention is not limited to this, and the light output surface may be formed of a surface other than the flat surface.

Besides, in the above embodiment, the example is described, in which the light projection direction is the horizontal direction, for example; however, the present invention is not limited to this, and the light projection direction may not be the horizontal direction.

Besides, in the above embodiment, the example is described, in which the upper surface of the mount member is horizontal; however, the present invention is not limited to this, and the upper surface of the mount member may not be horizontal.

Besides, in the above embodiment, the example is described, in which the opening surface of the reflection member is perpendicular to the light projection direction; however, the present invention is not limited to this. The opening surface of the reflection member may not be perpendicular to the light projection direction. Besides, the opening surface of the reflection member may be a curved surface (corrugated surface), for example.

Besides, in the above embodiment, the example is described, in which the laser light entering from the light incident surface of the light collection member is reflected by the second reflection surface (the upper surface, the lower surface, the side surfaces) and guided to the light output surface; however, the present invention is not limited to this. For example, by forming the light collection member in such a way that the refractive index becomes smaller smoothly or stepwise from an inner portion toward an outer portion as in a graded-index optical fiber, the traveling direction of the laser light may be changed in the inside of the light collection member to guide the laser light to the light output surface.

The invention claimed is:
1. A light projection unit for projecting light in a predetermined direction, comprising:
a fluorescent member that includes an illuminated surface to which laser light is directed, converts at least part of the laser light into fluorescent light and outputs the fluorescent light from chiefly the illuminated surface; and
a reflection member that includes a first reflection surface which is disposed to oppose the illuminated surface of the fluorescent member and reflects the fluorescent light output from the fluorescent member; wherein the illuminated surface of the fluorescent member is inclined with respect to the predetermined direction in such a way that the illuminated surface faces in a direction opposite to a light projection direction.

2. The light projection unit according to claim 1, wherein the illuminated surface of the fluorescent member is inclined by an angle of more than 0 degrees to 30 degrees or smaller with respect to the predetermined direction.

3. The light projection unit according to claim 1, wherein a light intensity distribution of the fluorescent light output from the fluorescent member is a Lambertian distribution.

4. The light projection unit according to claim 1, wherein a line connecting a center of the illuminated surface of the fluorescent member and an end portion of the first reflection surface in the predetermined direction with each other is inclined by 60 degrees or more with respect to a perpendicular line of the illuminated surface of the fluorescent member in the predetermined direction.

5. The light projection unit according to claim 3, wherein a thickness of the fluorescent member is one tenth of or smaller than a dimension across both ends of the illuminated surface.

6. The light projection unit according to claim 3, wherein the illuminated surface of the fluorescent member is sufficiently larger than a spot region of the laser light that is directed to the illuminated surface.

7. The light projection unit according to claim 1, further comprising a metallic mount member on which the fluorescent member is mounted.

8. The light projection unit according to claim 1, further comprising a mount member that includes a mount surface on which the fluorescent member is mounted; wherein
the mount surface is inclined in a direction opposite to the light projection direction with respect to the predetermined direction.

9. The light projection unit according to claim 1, wherein the first reflection surface is formed so as to include at least part of either of a parabolic surface and an elliptic surface.

10. The light projection unit according to claim 1, further comprising a light collection member that includes a light incident surface from which the laser light is input and a light output surface that has an area smaller than the light incident surface and outputs the laser light to the fluorescent member; wherein
the light collection member has a function to change, in an inside of the light collection member, a traveling direction of the laser light that enters from the light incident surface and to guide the laser light to the light output surface.

11. The light projection unit according to claim 10, wherein the light collection member further includes a second reflection surface that reflects the laser light entering from the light incident surface and guides the laser light to the light output surface.

12. The light projection unit according to claim 10, wherein the light output surface of the light collection member is disposed away from the illuminated surface of the fluorescent member by a predetermined distance.

13. The light projection unit according to claim 10, wherein the light collection member is inclined with respect to a perpendicular line of the illuminated surface of the fluorescent member.

14. The light projection unit according to claim 13, wherein the light collection member is inclined in a direction opposite to the predetermined direction with respect to the perpendicular line of the illuminated surface of the fluorescent member.

15. The light projection unit according to claim 13, wherein the light collection member is inclined with respect to the perpendicular line of the illuminated surface of the fluorescent member by 10 degrees or more to 30 degrees or smaller.

16. The light projection unit according to claim 10, wherein the laser light output from a plurality of laser generators is input from the light incident surface of the light collection member.

17. The light projection unit according to claim 1, wherein the fluorescent member includes a fluorescent body; and
a volume occupation percentage of the fluorescent body in the fluorescent member is 90% or more.

18. A light projection apparatus comprising:
the light projection unit according to claim 1; and
a laser generator that outputs the laser light to the light projection unit.

19. A light projection unit for projecting light in a predetermined direction, comprising:
a fluorescent member that includes an illuminated surface to which laser light is directed, converts at least part of the laser light into fluorescent light and outputs the fluorescent light; and
a reflection member that includes a first reflection surface which is disposed to oppose a surface of the fluorescent member configured to output the fluorescent light and reflects the fluorescent light output from the fluorescent member; wherein
the surface of the fluorescent member configured to output the fluorescent light is inclined with respect to the predetermined direction in such a way that the surface configured to output the fluorescent light faces in a direction opposite to a light projection direction.

20. The light projection unit according to claim 19, wherein the surface of the fluorescent member configured to output the fluorescent light is inclined by an angle of more than 0 degrees to 30 degrees or smaller with respect to the predetermined direction.

* * * * *